US009806009B2

(12) United States Patent
Fujino et al.

(10) Patent No.: US 9,806,009 B2
(45) Date of Patent: Oct. 31, 2017

(54) SEMICONDUCTOR DEVICE AND POWER CONVERTER USING THE SAME

(71) Applicant: Hitachi Automotive Systems, Ltd., Hitachinaka-shi, Ibaraki (JP)

(72) Inventors: Shinichi Fujino, Hitachinaka (JP); Takashi Kume, Hitachinaka (JP)

(73) Assignee: Hitachi Automotive Systems, Ltd., Hitachinaka-shi (JP)

( * ) Notice: Subject to any disclaimer, the term of this patent is extended or adjusted under 35 U.S.C. 154(b) by 0 days.

(21) Appl. No.: 15/108,093

(22) PCT Filed: Nov. 28, 2014

(86) PCT No.: PCT/JP2014/081491
§ 371 (c)(1),
(2) Date: Jun. 24, 2016

(87) PCT Pub. No.: WO2015/104914
PCT Pub. Date: Jul. 16, 2015

(65) Prior Publication Data
US 2016/0322286 A1 Nov. 3, 2016

(30) Foreign Application Priority Data

Jan. 9, 2014 (JP) .................................. 2014-002080

(51) Int. Cl.
*H01L 23/495* (2006.01)
*H01L 23/48* (2006.01)
(Continued)

(52) U.S. Cl.
CPC ...... *H01L 23/49575* (2013.01); *H01L 21/486* (2013.01); *H01L 21/54* (2013.01);
(Continued)

(58) Field of Classification Search
CPC ... H01L 23/49575; H01L 23/36; H01L 23/40; H01L 23/49517; H01L 23/49537; H01L 23/49541
(Continued)

(56) References Cited

U.S. PATENT DOCUMENTS 6,707,138 B2 * 3/2004 Crowley ........... H01L 23/49513
257/139
8,455,987 B1 * 6/2013 Spann ..................... H01L 21/56
257/675

(Continued)

FOREIGN PATENT DOCUMENTS

JP   2003-152159 A    5/2003
JP   2003-324176 A   11/2003
(Continued)

OTHER PUBLICATIONS

International Search Report (PCT/ISA/210) issued in PCT Application No. PCT/JP2014/081491 dated Feb. 24, 2015 with English translation (3 pages).
(Continued)

*Primary Examiner* — Nitin Parekh
(74) *Attorney, Agent, or Firm* — Crowell & Moring LLP

(57) ABSTRACT

To suppress a temperature rise of a chip accompanying a production of large output by a power converter, and to reduce a size of the power converter. A power semiconductor device includes: a first power semiconductor element to configure an upper arm of an inverter circuit; a second power semiconductor element to configure a lower arm of the inverter circuit; a first lead frame to transmit power to the first power semiconductor element; a second lead frame to transmit power to the second power semiconductor element; a first gate lead frame to transmit a control signal to the first power semiconductor element; and a sealing member to seal the first power semiconductor element, the second power (Continued)

semiconductor element, the first lead frame, the second lead frame, and the first gate lead frame. In the power semiconductor device, a through-hole is formed in the sealing member, and a part of the first gate lead frame and a part of the second lead frame are exposed to an inner peripheral surface of the through-hole.

10 Claims, 20 Drawing Sheets

(51) Int. Cl.
    *H02M 7/48*         (2007.01)
    *H01L 23/00*         (2006.01)
    *H02M 7/00*         (2006.01)
    *H01L 21/48*         (2006.01)
    *H01L 21/54*         (2006.01)
    *H02M 7/44*         (2006.01)
    *H01L 23/492*       (2006.01)

(52) U.S. Cl.
    CPC ........ *H01L 23/48* (2013.01); *H01L 23/49517* (2013.01); *H01L 23/49537* (2013.01); *H01L 23/49541* (2013.01); *H01L 23/49568* (2013.01); *H01L 24/33* (2013.01); *H01L 24/36* (2013.01); *H01L 24/40* (2013.01); *H02M 7/003* (2013.01); *H02M 7/44* (2013.01); *H02M 7/48* (2013.01); *H01L 23/492* (2013.01); *H01L 23/49524* (2013.01); *H01L 2224/40137* (2013.01); *H01L 2224/40247* (2013.01); *H01L 2224/48247* (2013.01); *H01L 2224/73221* (2013.01); *H01L 2224/73263* (2013.01); *H01L 2224/73265* (2013.01); *H01L 2924/13055* (2013.01)

(58) Field of Classification Search
    USPC .................................................. 257/675, 723
    See application file for complete search history.

(56) References Cited

U.S. PATENT DOCUMENTS

| | | | |
|---|---|---|---|
| 2001/0018235 A1* | 8/2001 | Choi | H01L 23/3121 |
| | | | 438/122 |
| 2004/0061206 A1* | 4/2004 | Son | H01L 23/4334 |
| | | | 257/675 |
| 2005/0121777 A1 | 6/2005 | Hata et al. | |
| 2007/0075409 A1* | 4/2007 | Letterman, Jr. | H01L 21/561 |
| | | | 257/678 |
| 2007/0108600 A1 | 5/2007 | Hata et al. | |
| 2008/0211010 A1 | 9/2008 | Hata et al. | |
| 2010/0078784 A1* | 4/2010 | Otremba | H01L 23/3107 |
| | | | 257/676 |
| 2010/0133670 A1* | 6/2010 | Liu | H01L 23/49524 |
| | | | 257/675 |
| 2013/0201741 A1* | 8/2013 | Tompkins | H02M 7/003 |
| | | | 363/131 |
| 2013/0334677 A1* | 12/2013 | Otremba | H01L 23/4952 |
| | | | 257/706 |
| 2014/0103510 A1* | 4/2014 | Andou | H01L 23/49551 |
| | | | 257/676 |

FOREIGN PATENT DOCUMENTS

| | | |
|---|---|---|
| JP | 2004-273749 A | 9/2004 |
| JP | 2005-167013 A | 6/2005 |

OTHER PUBLICATIONS

Japanese-language Written Opinion (PCT/ISA/237) issued in PCT Application No. PCT/JP2014/081491 dated Feb. 24, 2015 (3 pages).

* cited by examiner

SEMICONDUCTOR DEVICE AND POWER CONVERTER USING THE SAME

TECHNICAL FIELD

The present invention particularly relates to a power converter of a hybrid car or an electric car, and a semiconductor device that is used in the power converter.

BACKGROUND ART

Recently, there is a demand for higher output in power converters for a hybrid car, an electric car and the like in order for further improvement of fuel efficiency, and in regard to this, an attempt for realizing high current and low loss has proceeded. In addition, there is a demand for reduction in size of the power converter. Conventionally, the reduction in size and thermal resistance is realized depending on arrangement of semiconductor elements configuring the power converter or a method of connecting the semiconductor elements.

CITATION LIST

Patent Literature

PTL 1: Japanese Patent Application Laid-Open No. 2003-324176

SUMMARY OF INVENTION

Technical Problem

An object of the present invention is to suppress a temperature rise of a chip accompanying a production of large output by a power converter, and to reduce a size of the power converter.

Solution to Problem

A power semiconductor device includes: a first power semiconductor element to configure an upper arm of an inverter circuit; a second power semiconductor element to configure a lower arm of the inverter circuit; a first lead frame to transmit power to the first power semiconductor element; a second lead frame to transmit power to the second power semiconductor element; a first gate lead frame to transmit a control signal to the first power semiconductor element; and a sealing member to seal the first power semiconductor element, the second power semiconductor element, the first lead frame, the second lead frame, and the first gate lead frame, in which a through-hole is formed in the sealing member, and a part of the first gate lead frame and a part of the second lead frame are exposed to an inner peripheral surface of the through-hole.

Advantageous Effects of Invention

According to the present invention, it is possible to connect a plurality of power semiconductor elements via a single gate lead frame, it is easy to obtain higher current and reduction in size of a semiconductor device, and further, it is possible to provide the semiconductor device with no deformation of the gate lead frame at the time of molding and high productivity.

DESCRIPTION OF EMBODIMENTS

Hereinafter, a description will be given regarding embodiments of a semiconductor device and a power converter according to the present invention with reference to the drawings. Incidentally, the same elements will be denoted by the same reference signs in the respective drawings, and the redundant description thereof will be omitted.

Hereinafter, the embodiments of the present invention will be described with reference to FIGS. 1 to 9(d).

Figure 1:
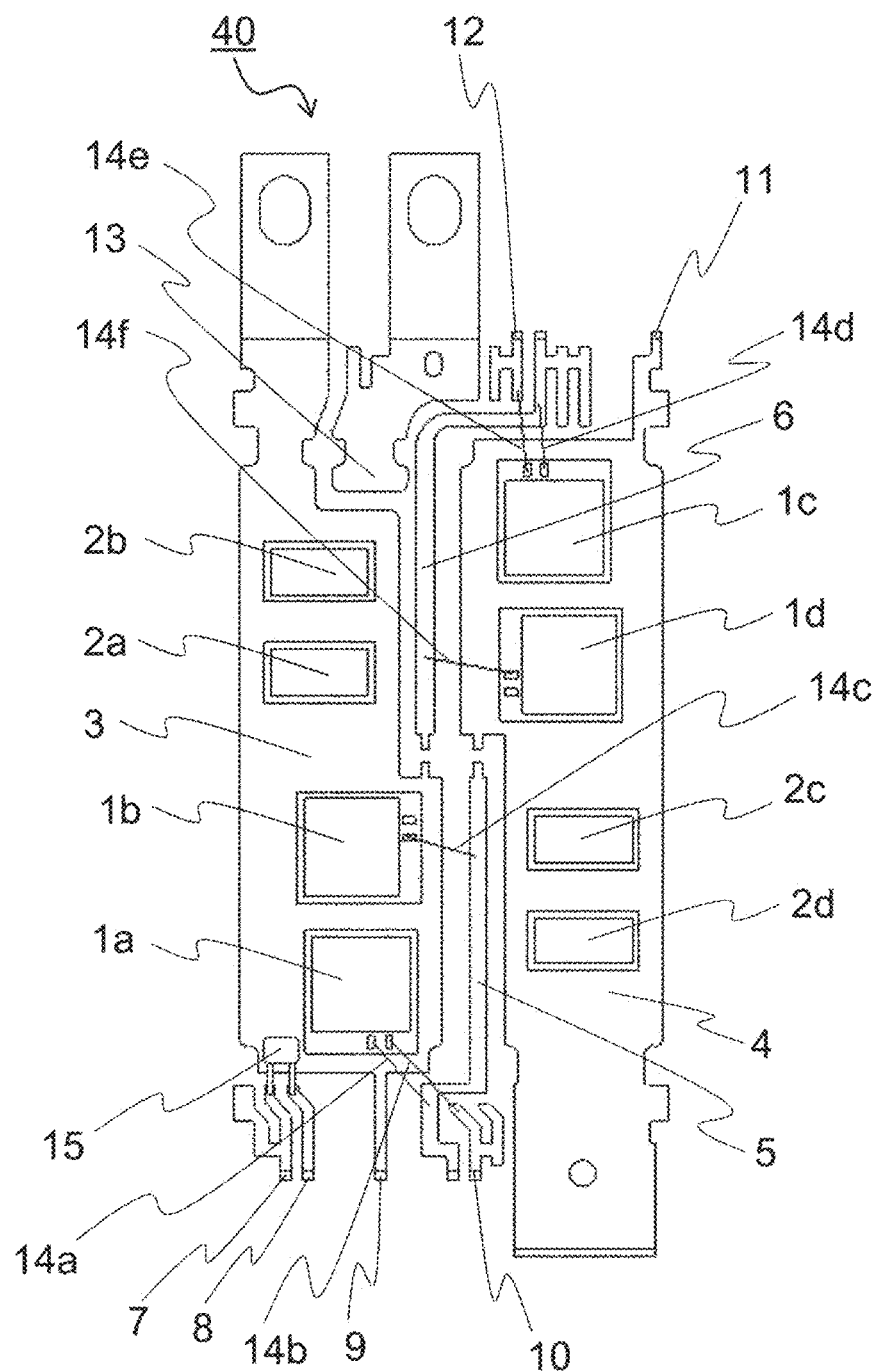
FIG. 1 illustrates an example of an embodiment of a semiconductor device according to the present invention.

FIG. 1 illustrates an example of the embodiments of a semiconductor device 40 according to the present invention. The semi conductor device 40 is provided with an inverter circuit which is configured of an insulated gate bipolar transistor (hereinafter, will be described as the IGBT) and a diode (hereinafter, will be described as the SFD). In addition, the semiconductor device 40 is provided with a first lead frame 3, a second lead frame 4, a first gate lead frame 5, a second gate lead frame 6, and a third lead frame 13 which are connected to IGBT chips 1a, 1b, 1c and 1d and SFD chips 2a, 2b, 2c, and 2d.

The IGBT chips 1a and 1b and the SFD chips 2a and 2b are connected onto the first lead frame 3 while being arranged in a row. The IGBT chips 1c and 1d and the SFD chips 2c and 2d are connected onto the second lead frame 4 while being arranged in a row. Here, a direction that is parallel to the arrangement direction of the IGBT chip and the SFD chip will be defined as a long-side direction of the corresponding lead frame in the first lead frame 3 and the second lead frame 4. In addition, a direction that is orthogonal to the long-side direction of the lead frame in a chip mounting plane of the lead frame will be defined as a short-side direction.

The first lead frame 3 is arranged such that the long-side direction of the first lead frame 3 and the long-side direction of the second lead frame 4 are parallel to each other. On the first lead frame 3, the IGBT chip 1a is adjacently arranged the IGBT chip 1b, and the SFD chip 2a is adjacently arranged the SFD chip 2b. On the second lead frame 4, the IGBT chip 1c is adjacently arranged the IGBT chip 1d, and the SFD chip 2c is adjacently arranged the SFD chip 2d. In addition, the IGBT chips 1a and 1b, which are arranged on the first lead frame 3, are arranged along the short-side directions of the SFD chips 2c and 2d, which are arranged on the second lead frame 4, and the second lead frame 4. The IGBT chips 1c and 1d, which are arranged on the second lead frame 4, are arranged along the short-side directions of the SFD chips 2a and 2b, which are arranged on the first lead frame 3, and the first lead frame in addition, the third lead frame 13 is adjacently arranged the first lead frame 3.

The first gate lead frame 5 is arranged between the first lead frame 3 and the second lead frame 4. The first gate lead frame 5 is arranged such that the long-side direction of the first gate lead frame 5 is parallel to the long-side direction of the first lead frame 3. The first gate lead frame 5 is arranged in a space between the IGBT chips 1a and 1b, which are mounted to the first lead frame 3, and the SFD chips 2c and 2d which are mounted to the second lead frame 4.

The second gate lead frame 6 is arranged between the first lead frame 3 and the second lead frame 4. The second gate lead frame 6 is arranged such that the long-side direction of the second gate lead frame 6 is parallel to the long-side direction of the first lead frame 3. The second gate lead frame 6 is arranged in a space between the SFD chips 2a and 2b, which are mounted to the first lead frame 3, and the IGBT chips 1c and 1d which are mounted to the second lead frame 4.

A gate electrode of the IGBT chip 1a is connected to the first gate lead frame 5 via an aluminum wire 14a. An emitter electrode of the IGBT chip 1a is connected to a first emitter lead 10 via an aluminum wire 14b. A gate electrode of an IGBT chip 1b is connected to the first gate lead frame 5 via an aluminum wire 14c.

A gate electrode of the IGBT chip 1c is connected to the second gate lead frame 6 via an aluminum wire 14d. An emitter electrode of the IGBT chip 1c is connected to a second emitter lead 12 via an aluminum wire 14e. A gate electrode of an IGBT chip 1d is connected to the second gate lead frame 6 via an aluminum wire 14f.

The first lead frame 3 includes a first collector lead 9 which is formed to be integrated with the first lead frame 3. The second lead frame 4 includes a second collector lead 11 which is formed to be integrated with the second lead frame 4.

The semiconductor device 40 includes a thermistor 15. The thermistor 15 is arranged such that a sensor portion of the thermistor 15 is in the vicinity of the IGBT chip 1a on the first lead frame 3. The thermistor 15 is connected to thermistor leads 7 and 8 via lead wires.

The first lead frame 3 has a region which is formed to overlap the second gate lead frame 6 on a virtual straight line passing through the second gate lead frame 6 and on a virtual straight line parallel to the long-side direction of the first lead frame 3. A portion protruding toward the second gate lead frame 6 is formed in the corresponding region. In the same manner, the second lead frame 4 has a region which is formed to overlap the first gate lead frame 5 on a virtual straight line passing through the first gate lead frame 5 and on a virtual straight line parallel to the long-side direction of the second lead frame 4. A portion protruding toward the first gate lead frame 5 is formed in the corresponding region. Details will be described later with reference to FIG. 5.

Figure 2:
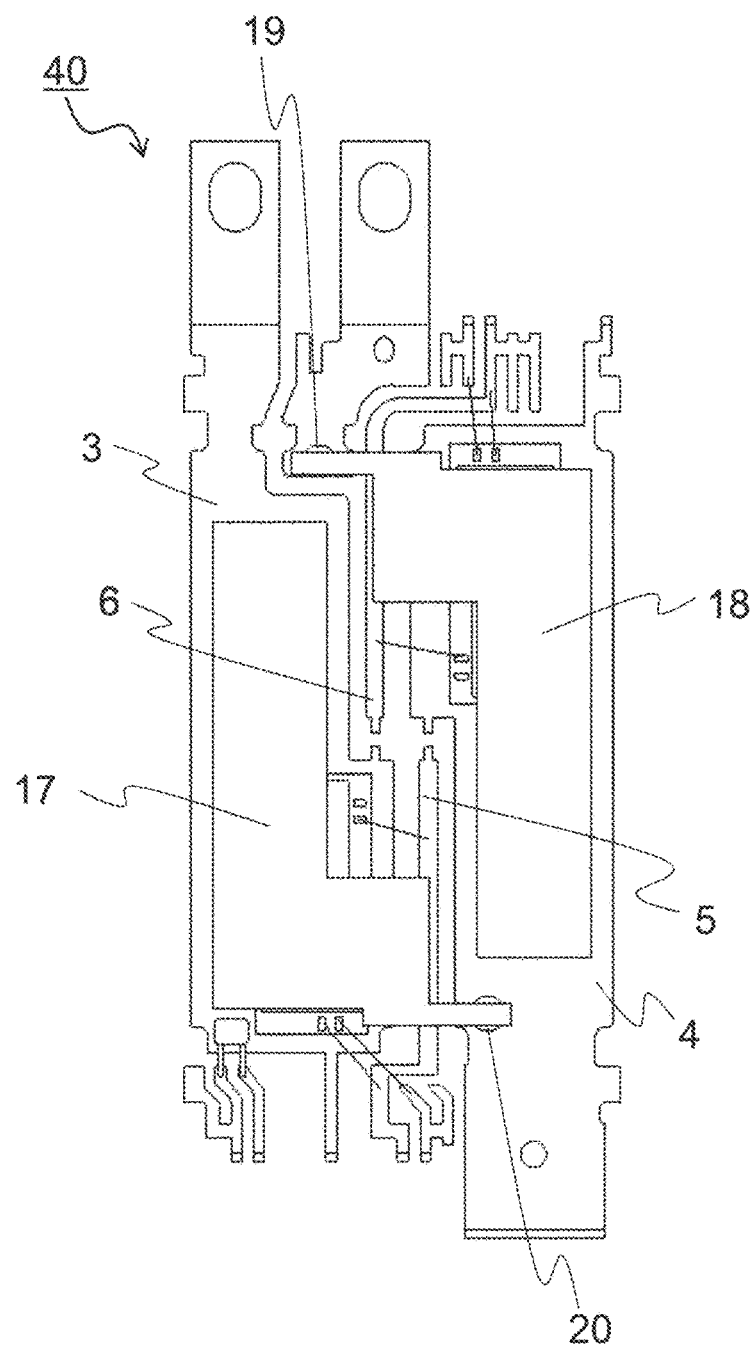
FIG. 2 is a plan view illustrating a configuration of a lead frame of the semiconductor device of FIG. 1.

FIG. 2 is a plan view illustrating a configuration of the lead frames of the semiconductor device of FIG. 1. FIG. 2 illustrates a state in which a fourth lead frame 17 and a fifth lead frame 18 are additionally connected in the state illustrated in FIG. 1.

The fourth lead frame 17 is arranged to oppose the first lead frame 3 with the IGBT chips 1a and 1b and the SFD chips 2a and 2b interposed therebetween. Each of the IGBT chips 1a and 1b and the SFD chips 2a and 2b has one surface being connected to the first lead frame 3 and the other surface being connected to the fourth lead frame 17. In addition, the fourth lead frame 17 is formed such that an end of the fourth lead frame 17 is connected to the second lead frame 4 via a solder 20.

The fifth lead frame 18 is arranged to oppose the second lead frame 4 with the IGBT chips 1c and 1d and the SFD chips 2c and 2d interposed therebetween. Each of the IGBT chips 1c and 1d and the SFD chips 2c and 2d has one surface being connected to the second lead frame 4 and the other surface being connected to the fifth lead frame 18. In addition, the fifth lead frame 18 is formed such that an end of the fifth lead frame 18 is connected to the third lead frame 13 via a solder 19.

Figure 3:
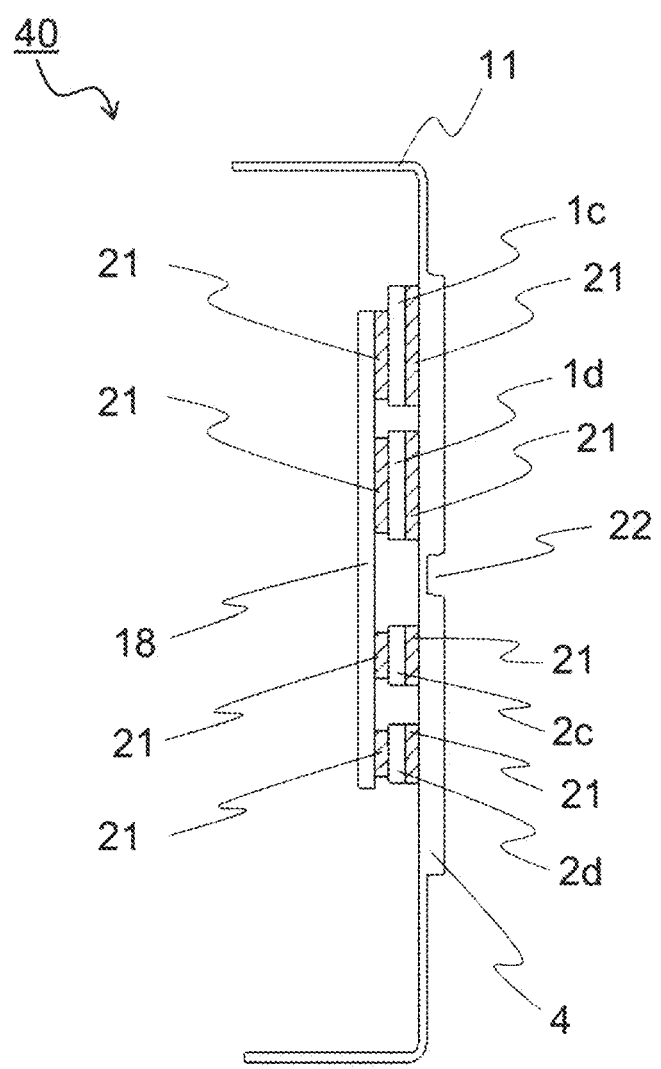
FIG. 3 is a right side view of FIG. 2.

FIG. 3 illustrates a side view of the semiconductor device 40 illustrated in FIG. 2. The IGBT chips 1c and 1d and the SFD chips 2c and 2d, illustrated in FIG. 3, are connected to the second lead frame 4 and the fifth lead frame 18 via solders 21.

As illustrated in FIG. 3, a recess 22 is formed at a substantially central portion in the long-side direction in the second lead frame 4. The IGBT chips 1c and 1d are arranged on the opposite side to a side on which the SFD chips 2c and 2d are arranged with the recess 22 interposed therebetween. Although not illustrated, the recess 22 is formed in the same manner also in the first lead frame 3, the first gate lead frame 5, and the second gate lead frame 6 The recess 22 is formed using a method such as drawing processing.

Figure 4:
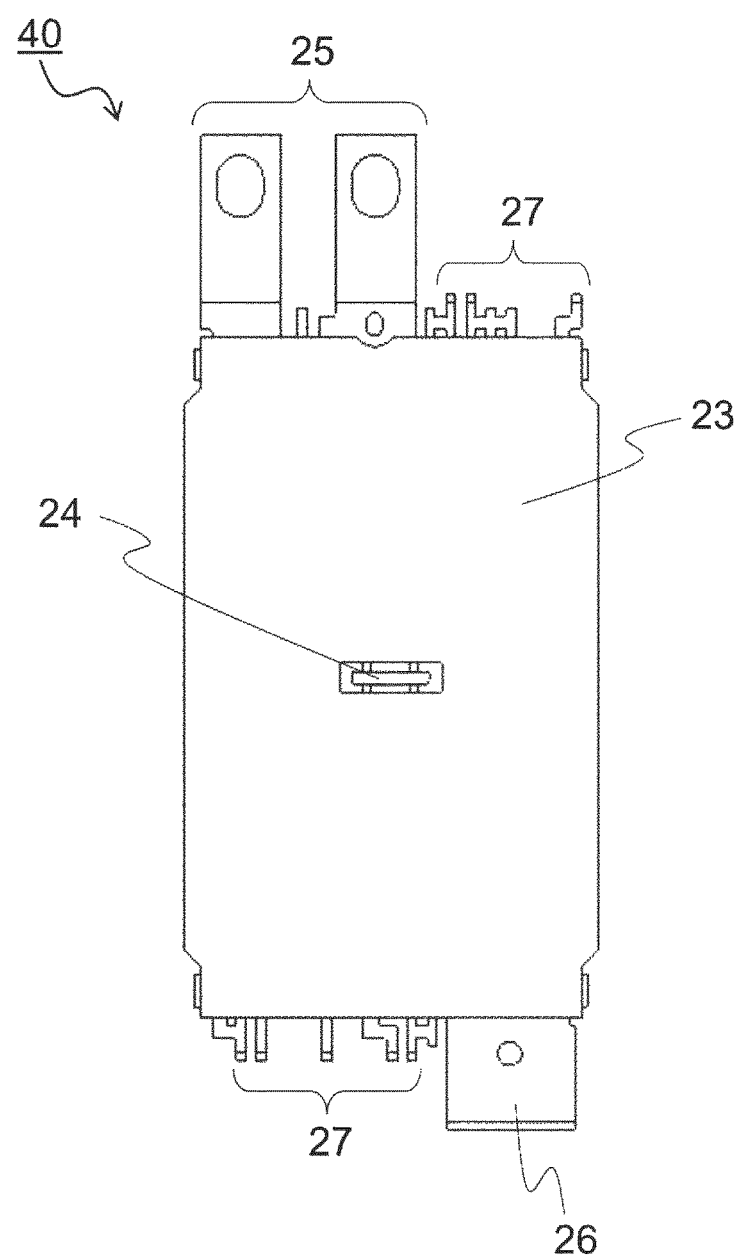
FIG. 4 is an external view of the semiconductor device of FIG. 1.

FIG. 4 is an external view of the semiconductor device 40. The semiconductor device 40 is sealed by a mold 23. The first lead frame 3 and the third lead frame 13 are formed such that each part of the lead frames protrudes to the outside of the mold 23, thereby forming a bus bar 25 for electrical connection. In the same manner, the second lead frame 4 is formed such that a part of the second lead frame protrudes to the outside of the mold 23, thereby forming a bus bar 26 for electrical connection. The bus bar 26 is formed along the long-side direction of the lead frame, and protrudes in the opposite direction to the bus bar 25. In addition, a gate pin 27 is also formed to protrude from the mold 23 along the long-side direction of the lead frame similarly to the bus bars 25 and 26. The gate pin 27 is formed as each part of the first gate lead frame 5, the second gate lead frame 6, the thermistor leads 7 and 8, the first collector lead 9, the first emitter lead 10, the second collector lead 11, and the second emitter lead 12.

The mold 23 has a through-hole 24 which is formed at substantially the center of the semiconductor device 40. The through-hole 24 will be described with reference to FIGS. 5 to 7.

Figure 5:
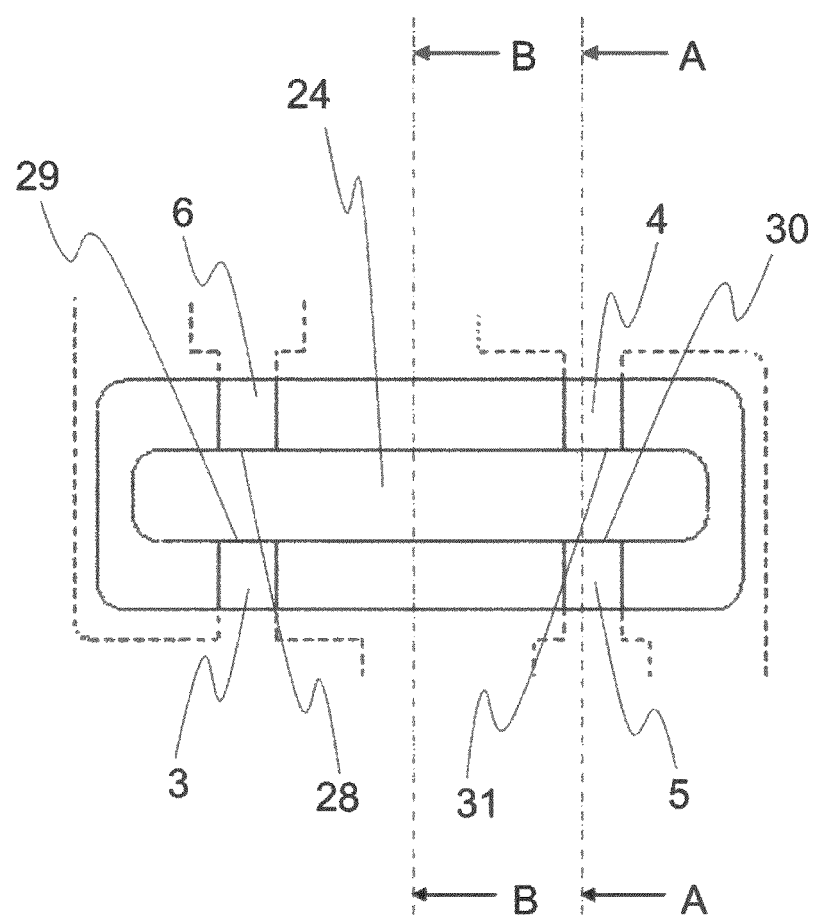
FIG. 5 is a partial enlarged view of FIG. 4.

FIG. 5 is a partially enlarged view of FIG. 4. The through-hole 24 is formed to pass through the second gate lead frame 6 and to straddle between the first lead frame 3 and the second gate lead frame 6 on the virtual straight line which is parallel to the long-side direction of the first lead frame 3. In addition, the through-hole 24 is formed to pass through the first gate lead frame 5 and to straddle between the second lead frame 4 and the first gate lead frame 5 on the virtual straight line which is parallel to the long-side direction of the second lead frame 4.

The second gate lead frame 6 has a distal end which is thin and formed toward the through-hole 24 along the long-side direction of the first lead frame 3, and this distal end forms a cut surface 28. The first lead frame 3 has a distal end which is thin and formed toward the through-hole 24 along the long-side direction of the first lead frame 3, and this distal end forms a cut surface 29. The first gate lead frame 5 has a distal end which is thin and formed toward the through-hole 24 along the long-side direction of the second lead frame 4, and this distal end forms a cut surface 30. The second lead frame 4 has a distal end which is thin and formed toward the through-hole 24 along the long-side direction of the second lead frame 4, and the distal end forms a cut surface 31.

The cut surface 28 of the second gate lead frame 6 opposes the cut surface 29 of the first lead frame 3. The cut surface 30 of the first gate lead frame 5 opposes the cut surface 31 of the second lead frame 4. The cut surfaces 28, 29, 30 and 31 of the respective lead frames are formed on the same plane as the creepage of the through-hole 24.

Figure 6:
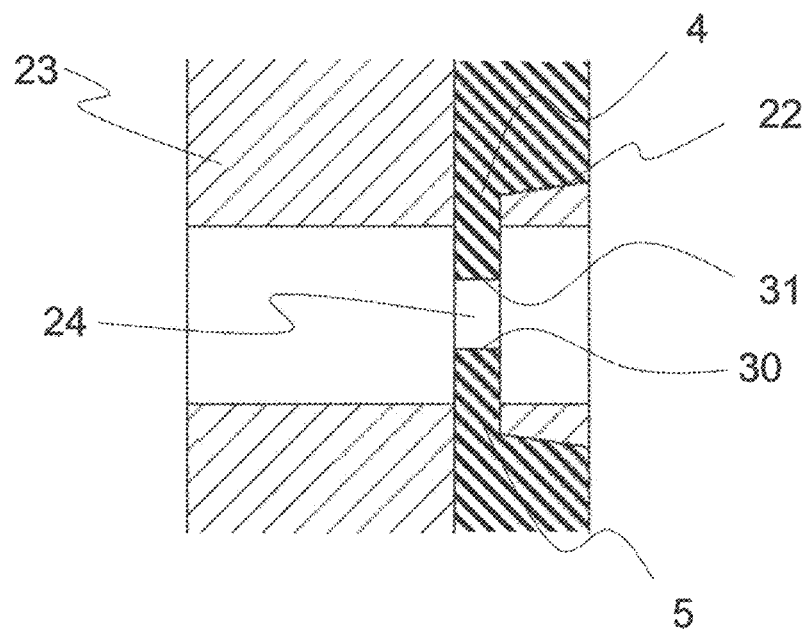
FIG. 6 is an A-A cross-sectional view of FIG. 5.
Figure 7:
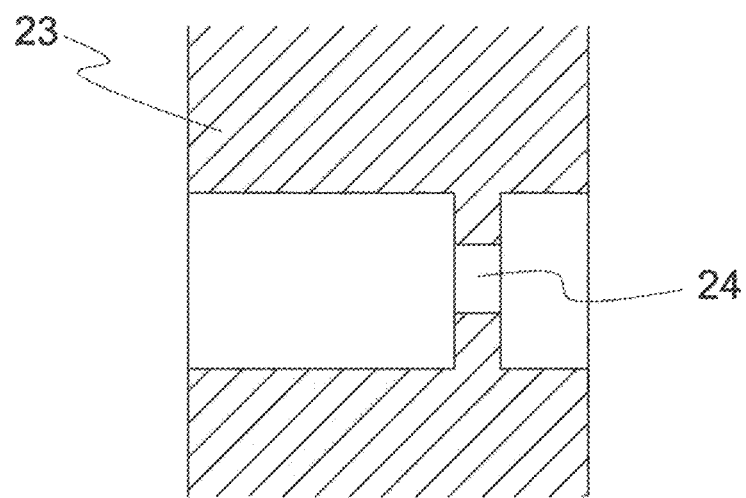
FIG. 7 is a B-B cross-sectional view of FIG. 5.

FIG. 6 is an A-A cross-sectional view of FIG. 5. FIG. 7 is a B-B cross-sectional view of FIG. 5. As illustrated in the drawings, the first lead frame 4 and the second gate lead frame 5 have the distal ends which are thin and formed toward the through-hole 24 and the distal ends form the cut surfaces. The through-hole 24 is formed at a substantially central portion of a region in which the recess 22 of each lead frame is formed. In addition, the mold 23 is formed even in an inner side of the recess 22. That is, the lead frame exposed from the mold 23 has a thinner film thickness than a part in which the chip is formed.

Figure 8:
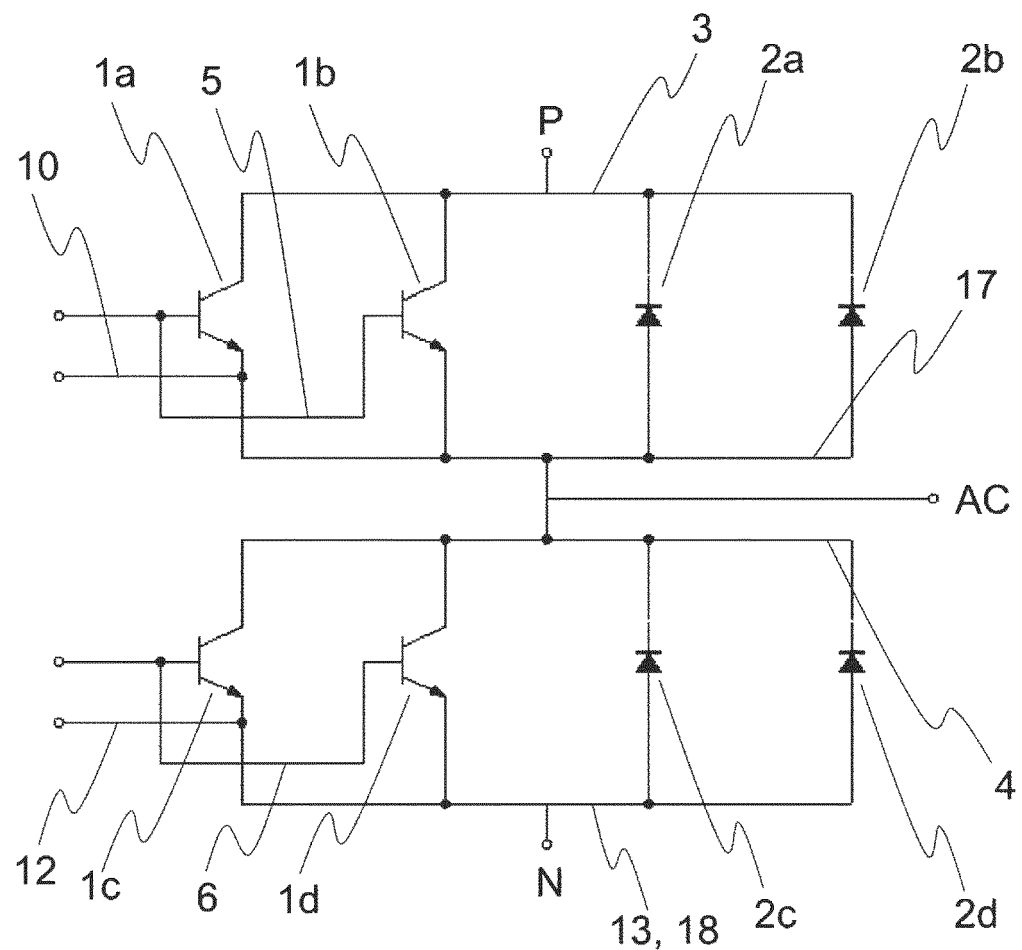
FIG. 8 illustrates an equivalent circuit of the semiconductor device of FIG. 1.

FIG. 8 illustrates an equivalent circuit of the semiconductor device 40. The first lead frame 3 forms a positive potential P, the fourth lead frame 17 and the second lead frame 4 form intermediate potentials AC, and the third lead frame 13 and the fifth lead frame 18 form, negative potentials N. The IGBT chips 1a, 1b, 1c and 1d are turned ON and OFF by changing a gate potential with respect to a collector potential. The collector potential of the IGBT chips 1a and 1b becomes the intermediate potential AC, the collector potential of the IGBT chips 1c and 1d becomes the negative potential N.

In the semiconductor device described above, the first gate lead frame 5 and the second gate lead frame 6 are arranged between the first lead frame 3 and the second lead frame 4, and the first gate lead frame 5 and the second gate lead frame 6 are adjacent to the IGBTs 1a, 1b, 1c, and 1d. Accordingly, it is possible to connect the gate electrodes of the IGBTs 1a and 1b to the first gate lead frame 5, and further, to connect the gate electrodes of the IGBTs 1c and 1d to the second gate lead frame 6. That is, it is possible to electrically connect gate signals of a plurality of the IGBT chips to the single lead frame. For example, in a case in which the number of IGBT chips is three or four, it is also possible to electrically connect the IGBT chips with the single lead frame by arranging the IGBT chips in a row as described above. Accordingly, at is unnecessary to add a lead frame for a gate signal even when the number of chips to be connected in parallel increases, and an increase in size accompanying the increase of the number of chips is suppressed.

In addition, the first gate lead frame 5 and the second gate lead frame 6 are provided between the IGBT chips 1a and 1b and the SFD chips 2a and 2b on an upper arm side and the IGBT chips 1c and 1d and the SFD chips 2c and 2d on a lower arm side, and thus, the thermal interference between the chips of the upper arm and the lower arm is suppressed. In addition, similarly, the thermal interference is suppressed also between the IGBT chips 1a, 1b, 1c and 1d, and the SFD chips 2a, 2b, 2c, and 2d as the recess 22 is provided therebetween. Accordingly, the temperature rise of the chip is small when the chip generates heat.

In addition, when the first lead frame 3 and the second lead frame 6 are formed using a copper plate made of a material with favorable thermal conductivity, the heat generated from the chips is likely to spread in the first lead frame 5 and the second lead frame 6. In addition, each heat capacity of the first lead frame 5 and the second lead frame 6 is large since the number of chips of the respective arms is plural including the two IGBT chips and the two SFD chips. Accordingly, there is no abrupt temperature rise of the chip.

In addition, the cut surface 29 of the first lead frame 3 and the cut surface 28 of the second gate lead frame 6 are provided at opposing positions, and the cut surface 31 of the second lead frame 4 and the cut surface 30 of the first gate lead frame 5 are provided at opposing positions as illustrated in FIG. 5. This is because the mold 23 is molded in a state in which the respective frames are connected to each other, and each connection portion is cut by cutting processing after the molding. That is, the distal ends of the first gate lead frame 5 and the second gate lead frame are connected and fixed to the first lead frame 3 and the second lead frame 4 at the time of molding. Accordingly, the deformation of the gate lead frame caused by a molding pressure at the time of molding is suppressed.

In addition, the through-hole 24 is formed to be narrow between the cut surfaces of the lead frames and to be wide in the other region as illustrated in FIG. 6. In other words, the cut portion of the lead frame is formed such that not only the cut surface is exposed from the mold 23 but also a part of the lead frame protrudes from the outer through-hole of the mold 23. In this manner, the through-hole is formed such that a part of the lead frame to be cut protrudes, and thus, it is possible to cut the connection portion in the state of being pressed from above and below using the mold or the like in the cutting processing of the connection portion between the first gate lead frame 5 and the second gate lead frame 6 after the molding. Accordingly, the processability is favorable, and the productivity is high. In addition, the mold 23 is not deformed due to the deformation of the cut surfaces 28, 29, 30 and 31 caused by the cutting processing.

Figure 9A:
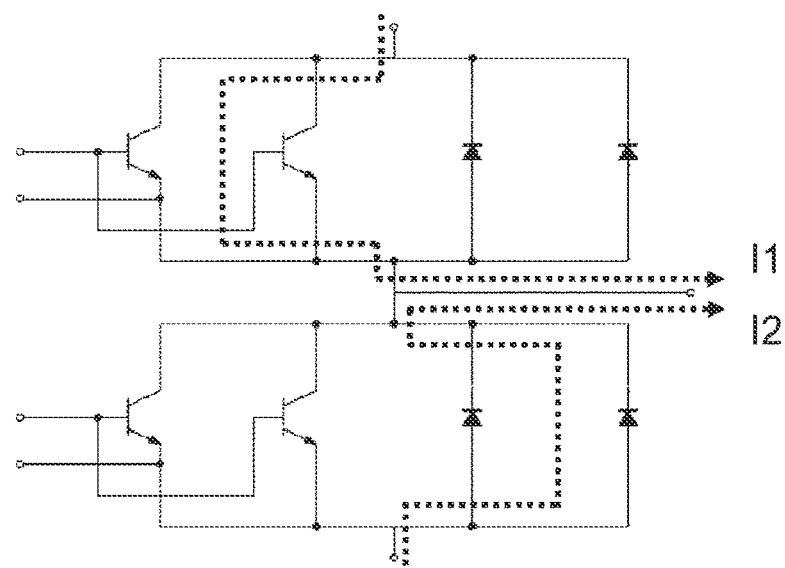
FIG. 9A illustrates a current streamline flowing in the equivalent circuit of FIG. 8.
Figure 9B:
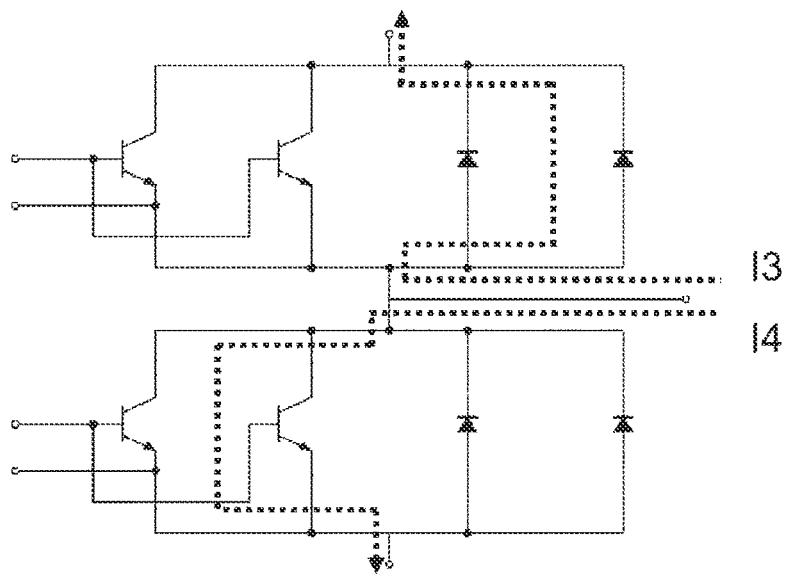
FIG. 9B illustrates a current streamline flowing in the equivalent circuit of FIG. 8.
Figure 9C:
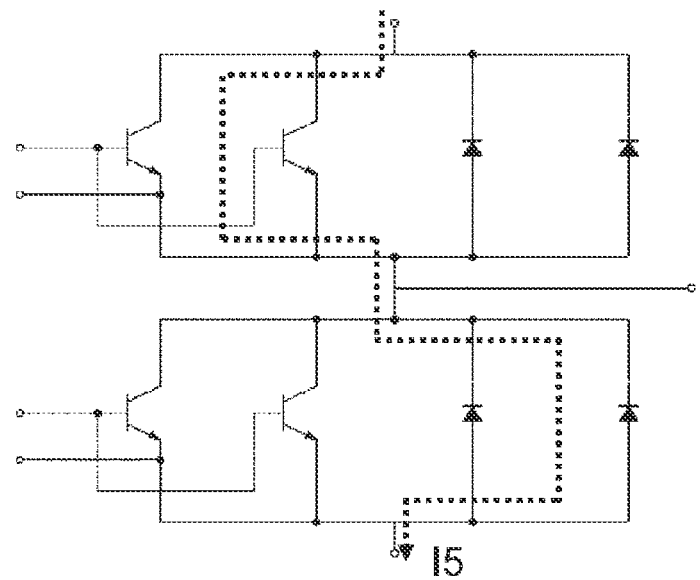
FIG. 9C illustrates a current streamline flowing in the equivalent circuit of FIG. 8.
Figure 9D:
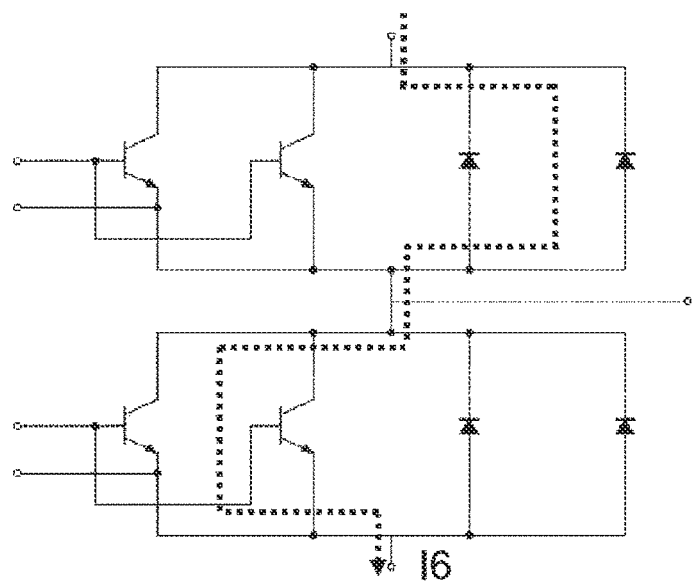
FIG. 9D illustrates a current streamline flowing in the equivalent circuit of FIG. 8.

FIGS. 9(a) to 9(d) illustrate current streamlines flowing in the equivalent circuit of FIG. 8. FIG. 9(a) illustrates a state in which a current flows alternately to the IGBT chips 1a and 1b, and the SFD chips 2c and 2d. The current varies between I1 and I2 depending on the turning ON and OFF of the IGBT chips 1a and 1b. FIG. 9(b) illustrates a state in which a current flows alternately to the IGBT chips 1c and 1d, and the SFD chips 2a and 2b. The current varies between I3 and I4 depending on the turning ON and OFF of the IGBT chips 1c and 1d. FIG. 9(c) illustrates a recovery current I5 which is generated when the IGBT chips 1a and 1b are turned ON in FIG. 9(a). FIG. 9(d) illustrates a recovery current I6 which is generated when the IGBT chips 1c and 1d are turned ON in FIG. 9(b).

Figure 10:
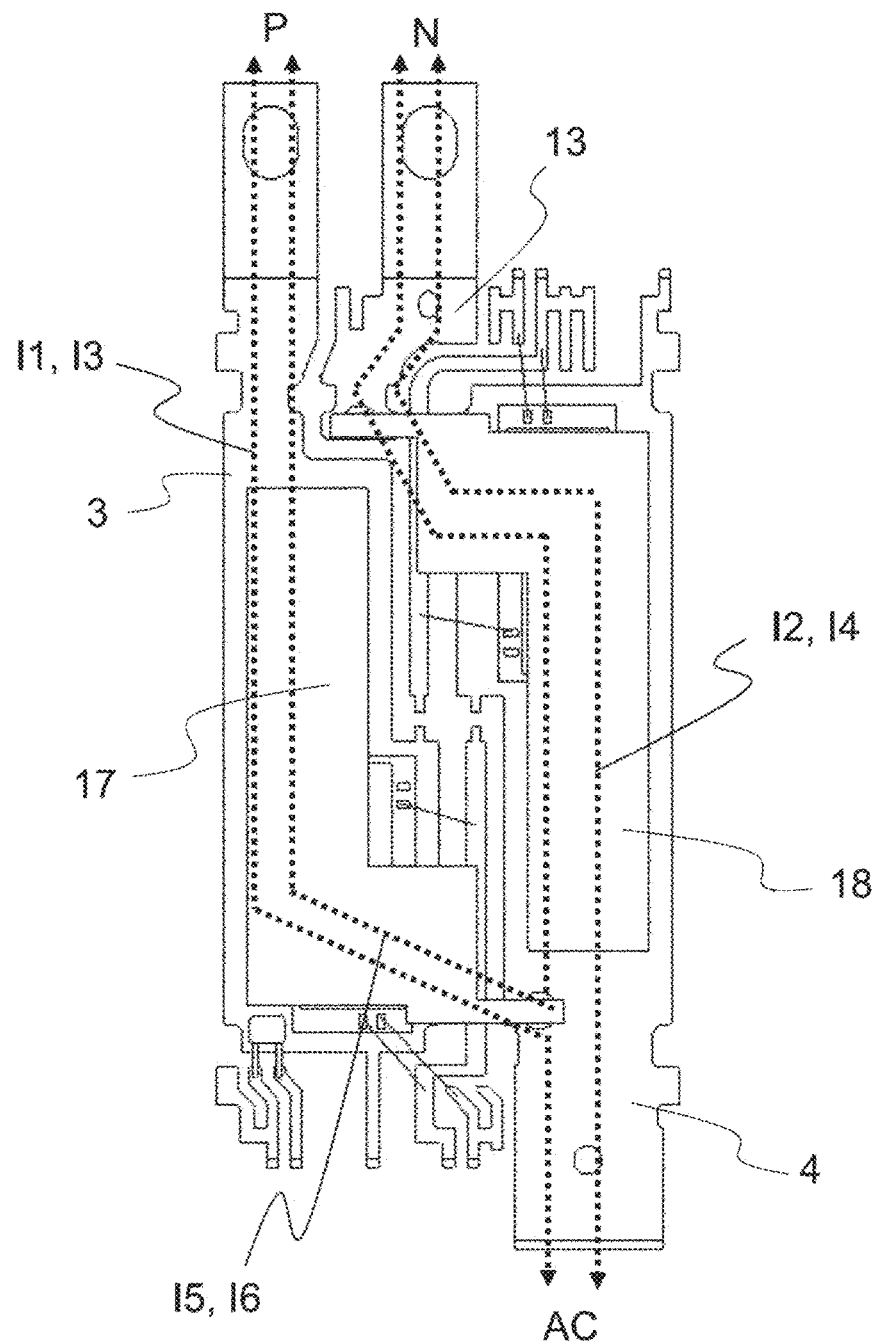
FIG. 10 illustrates a current streamline flowing in the semiconductor device of FIG. 2.

FIG. 10 illustrates the current streamline flowing in the semiconductor device 40. The currents I1 and I3 flow between the positive potential P and the intermediate potential AC via the first lead frame 3, the fourth lead frame 17, and the second lead frame 4. The currents I2 and I4 flow between the intermediate potential AC and the negative potential N via the second lead frame 4, the fifth lead frame 18, and the third lead frame 13. The currents I5 and I6 flow between the positive potential P and the negative potential N via the first lead frame 3, the fourth lead frame 17, the second lead frame 4, the fifth lead frame 18, and the third lead frame 13.

Each length of the current streamlines is equal regardless of any chip through which each of the currents I1 to I6 flows in the above-described semiconductor device. For example, the length of the streamline of the current I1 is equal in both cases in which the current I1 flows through either the IGBT chip 1a or the IGBT chip 1b. Accordingly, each path length of the currents flowing in the chips that are connected in parallel, for example, the IGBT chips 1a and 1b, and the SFD chips 1a and 1b, becomes equal, and the current imbalance among the chips is suppressed. The same effect as above is obtained even when the number of chips that are connected in parallel further increases.

In addition, the currents I5 and I6 flow to eddy in the semiconductor device 40. Accordingly, a magnetic field, which is orthogonal to the semiconductor device 40, is generated at the center of the eddy, and an eddy current caused by the magnetic field occurs in metal members that are adjacently arranged. The metal members that are adjacently arranged include a heat dissipation fin (heat dissipation fin 42 in FIG. 17) for example, which will be described later. The inductance of the current path is reduced, and a surge potential caused by the recovery current is reduced according to a magnetic field canceling effect caused by the eddy current.

In addition, the currents I1 and I2, and the currents I3 and I4 flow in an alternately changing manner as described, above, and the respective streamlines thereof neighbor on each other as, for example, the first lead frame 3 and the second lead frame 4 are adjacent to each other in parallel. Accordingly, a mutual inductance decreases according to a change in magnetic field that is generated when the current changes. Accordingly, the surge potential, which is generated when the IGBT chip is turned OFF, is reduced.

As described above, the emitter potentials of the IGBT chips 1a and 1b are the intermediate potential AC, and the second lead frame 4 and the fourth lead frame 17 have the same potential. On the other hand, the gate signals of the IGBT chips 1a and 1b flow in the first gate lead frame 5. As illustrated in FIG. 2, the first gate lead frame 5 is adjacent to the second lead frame 3 in parallel, and a part thereof overlaps the fourth lead frame 17. Accordingly, the gate signal is surrounded by the emitter potentials, and the noise immunity is high without being affected by the surge potential or noise from the outside. In the same manner, the emitter potentials of the IGBT chips 1c and 1d are the negative potential N, and the third lead frame 13 and the fifth lead frame 18 have the same potential. On the other hand, the gate signals of the IGBT chips 1c and 1d flow in the second gate lead frame 6. The second gate lead frame 5 has a part being adjacent to the third lead frame 13 in parallel, and has a part overlapping the fifth lead frame 18. Accordingly, the gate signal is surrounded by the emitter potentials, and the noise immunity is high without being affected by the surge potential or noise from the outside.

Hereinafter, a description will be given regarding a method of manufacturing the semiconductor device according to the present invention with reference to FIGS. 11 to 14.

Figure 11:
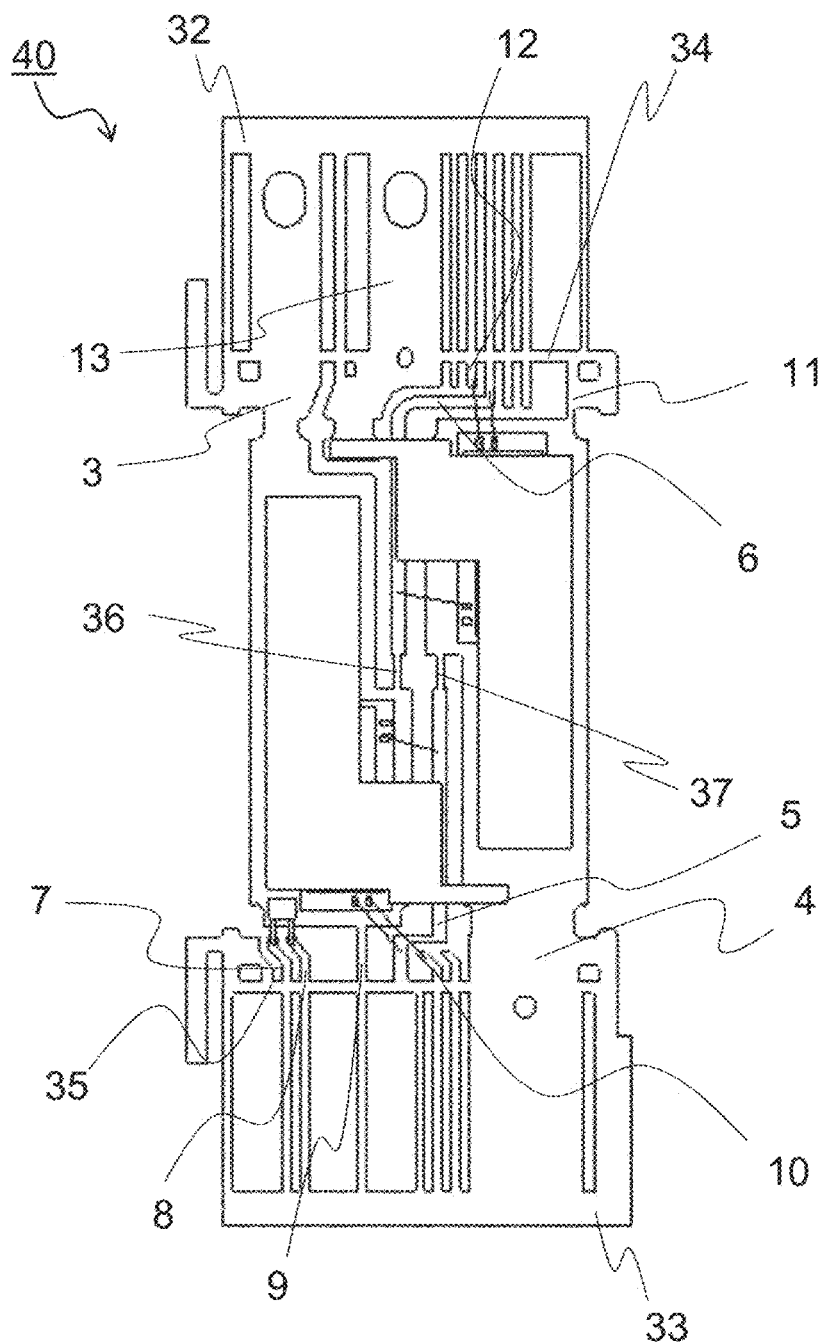
FIG. 11 is one process view in a manufacturing process of the semiconductor device according to the present invention.

FIG. 11 is a diagram illustrating a manufacturing process of the semiconductor device 40 according to the present invention. The first lead frame 3, the third lead frame 13, the second gate lead frame 6, the respective leads 11 and 12 are connected via tie bars 32 and 34. In the same manner, the second lead frame 4, the first gate lead frame 5, and the respective leads 7, 8, 9 and 10 are connected via tie bars 33 and 35. In addition, the first lead frame 3 and the second gate lead frame 6 are connected via a connection portion 36. The second lead frame 4 and the first gate lead frame 5 are connected via a connection portion 37.

Figure 12:
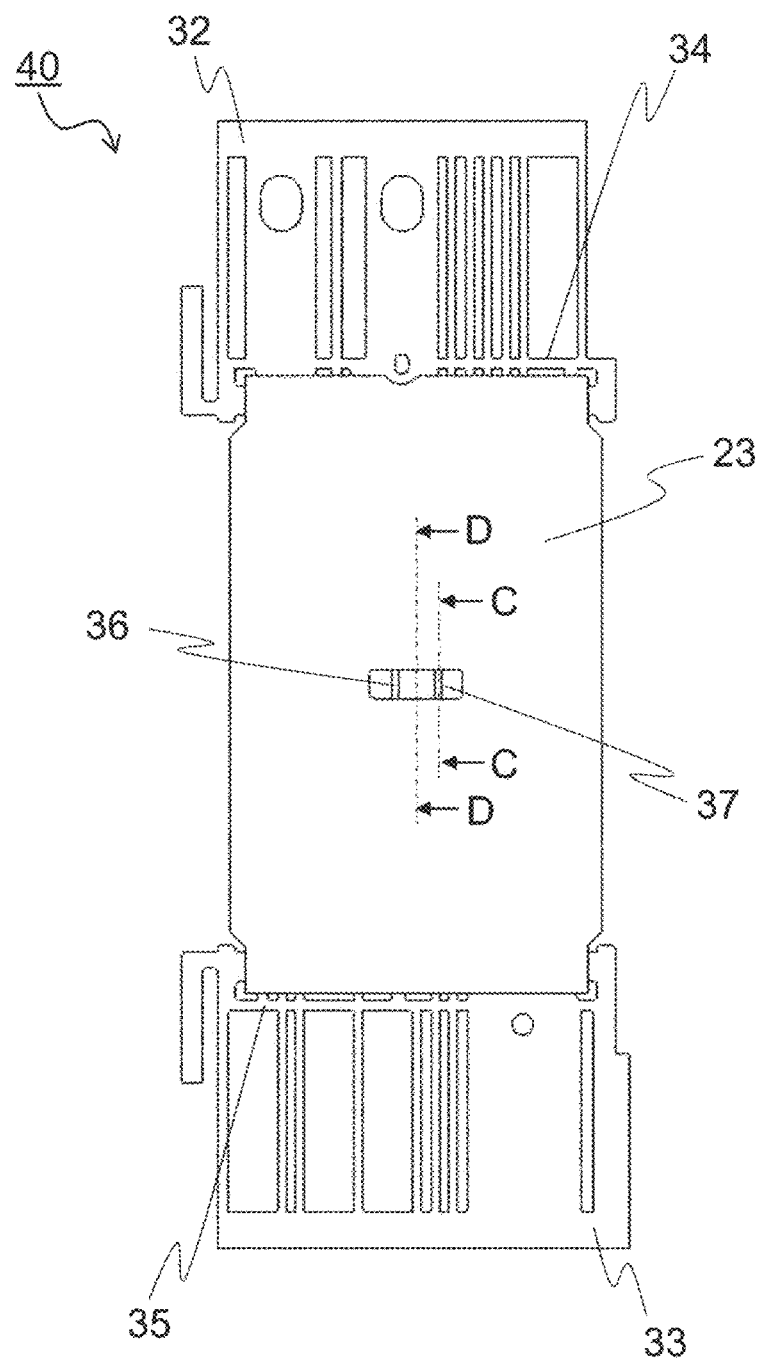
FIG. 12 is one process view in the manufacturing process after FIG. 11.

FIG. 12 illustrates a manufacturing process which is subsequent to FIG. 11. The mold 23 is molded in the semiconductor device 40. In the molding, the tie bars 32 to 35 and the connection portions 36 and 37 are molded in the state of being connected to each other. The mold 23 is formed in a region between the tie bar 34 and the tie bar 35.

Figure 13:
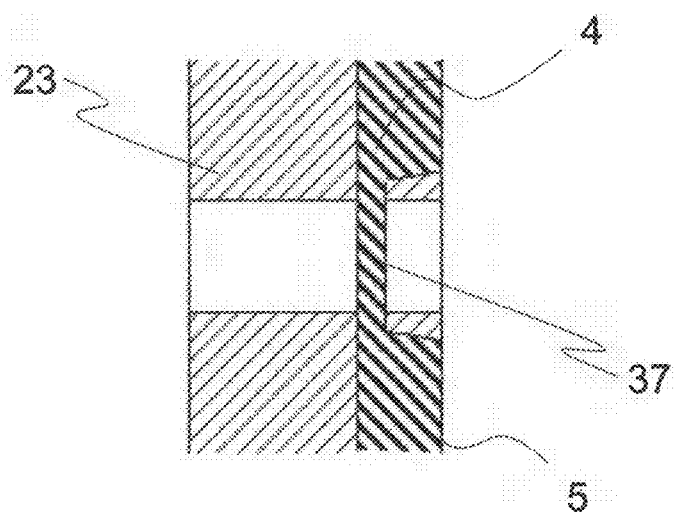
FIG. 13 is a C-C cross-sectional view of FIG. 12.
Figure 14:
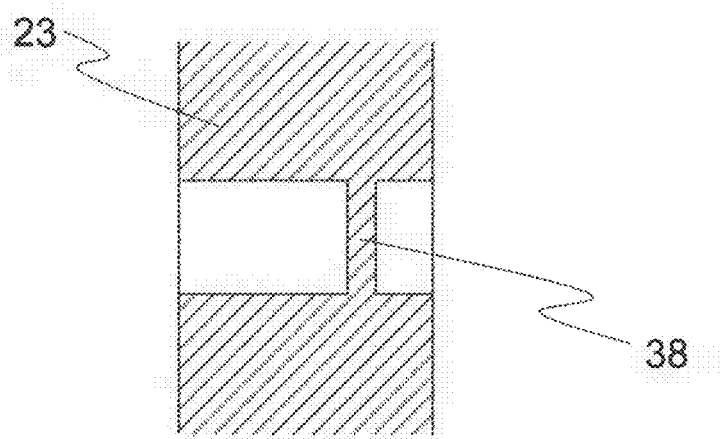
FIG. 14 is a D-D cross-sectional view of FIG. 12.

FIG. 13 is a cross-sectional view according to a C-C cross-section of FIG. 12. FIG. 14 is a cross-sectional view according to a D-D cross-section of FIG. 12. The second lead frame 4 and the first gate lead frame 5 are connected via the connection portion 37. In addition, a mold connection portion 38 is present in the same shape as the connection portion 37.

Figure 15:
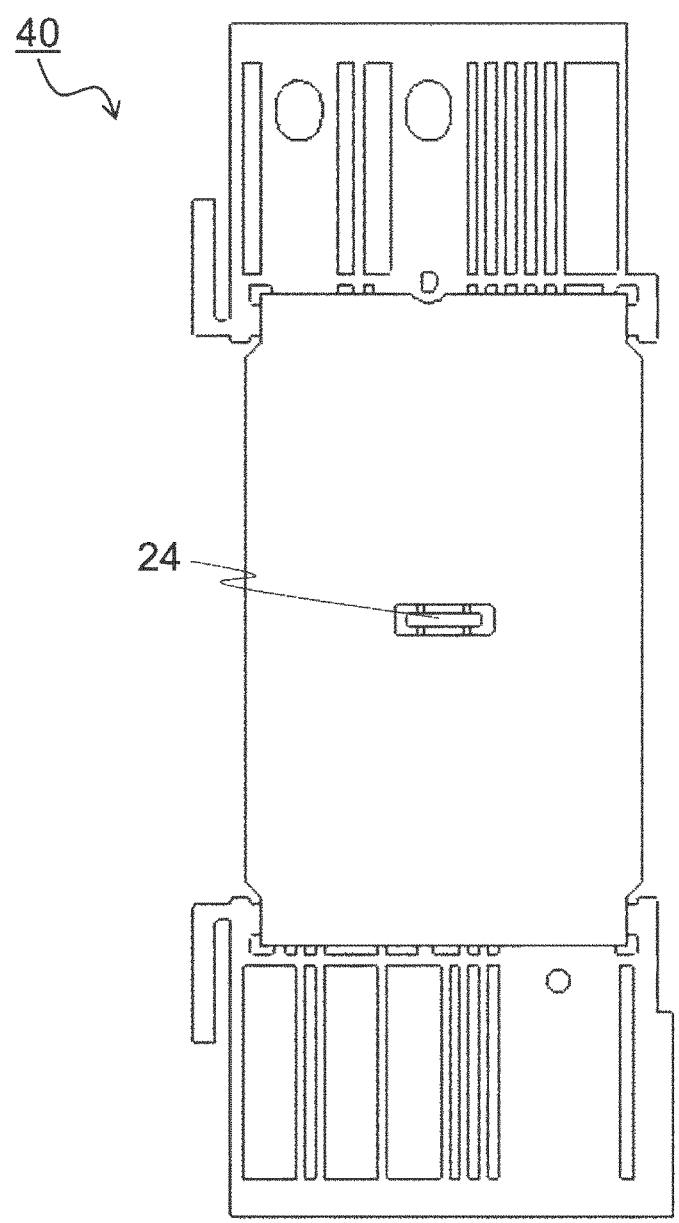
FIG. 15 is one process view in the manufacturing process after FIG. 12.

FIG. 15 illustrates a manufacturing process which is subsequent to FIG. 12. The through-hole 24 is formed through cutting processing. The connection portions 36 and 37, and the mold connection portion 38 are removed by the cutting processing.

Thereafter, the tie bars 32, 33, 34 and 35 are removed by cutting processing, and further, the bus bars 25 and 26, and the gate pin 27 are formed by bending processing (see FIG. 4).

In the above-described method of manufacturing the semiconductor device, the tie bars 32 to 35 and the connection portions 36 and 37 remain at the time of molding, and a state in which all the leads and lead frames are connected. Accordingly, the rigidity between the lead and the lead frame is higher than a state in which the respective leads and lead frames are separated.

In addition, the rigidity between the lead and the lead frame further becomes higher by fixing the tie bar and the connection portion using the mold for molding. Accordingly, there is no deformation of the lead and the lead frame caused by the molding pressure, and it is possible to remove the remaining tie bar and connection portion, and the mold connection portion, which is formed by molding, by performing the cutting processing after the molding. Accordingly, it is possible to perform the manufacture using successive processes from the molding to the cutting processing, and the productivity is high.

Hereinafter, a description will be given regarding cooling structure of the semiconductor device according to the present invention with reference to FIGS. 16 and 17.

Figure 16:
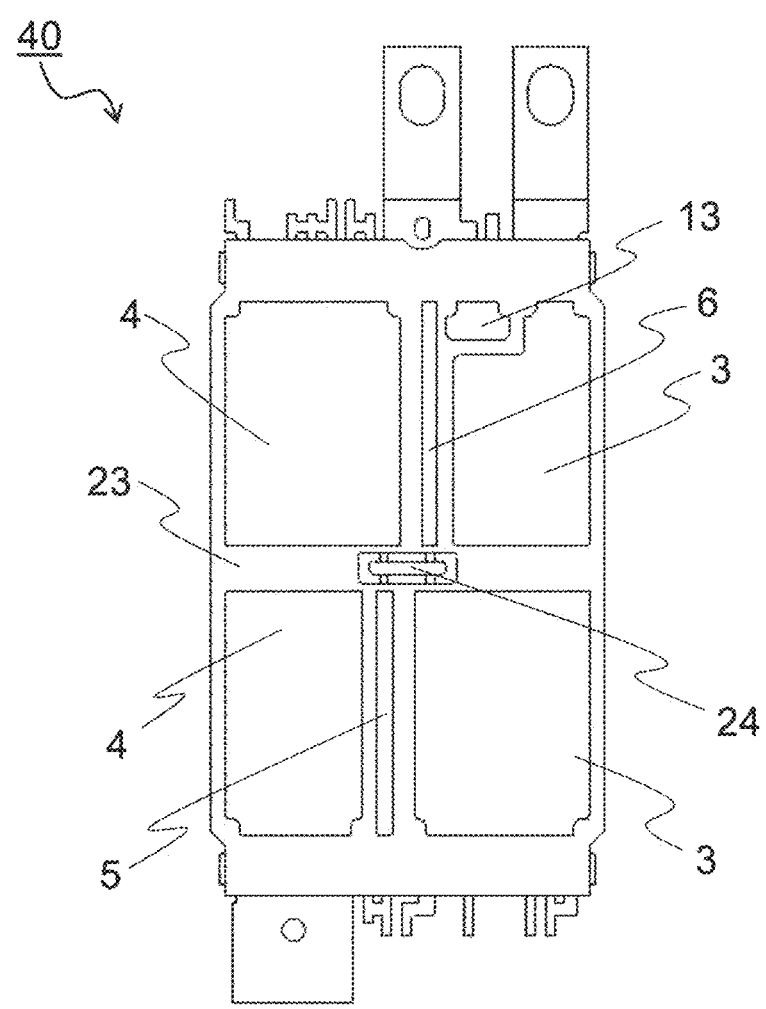
FIG. 16 is a rear view of FIG. 4.

FIG. 16 is a rear view of the semiconductor device 40 which is seen from a point of view on the opposite side to that of FIG. 4. The first lead frame 3, the second lead frame 4, the third lead frame 13, the first gate lead frame 5, and the second gate lead frame 6 have cooling surfaces, which are exposed from the mold 23, on the same plane as the surface of the mold 23. In addition, the mold 23 is molded on the recess 22, and the through-hole 24 is provided on the inner side thereof.

Figure 17:
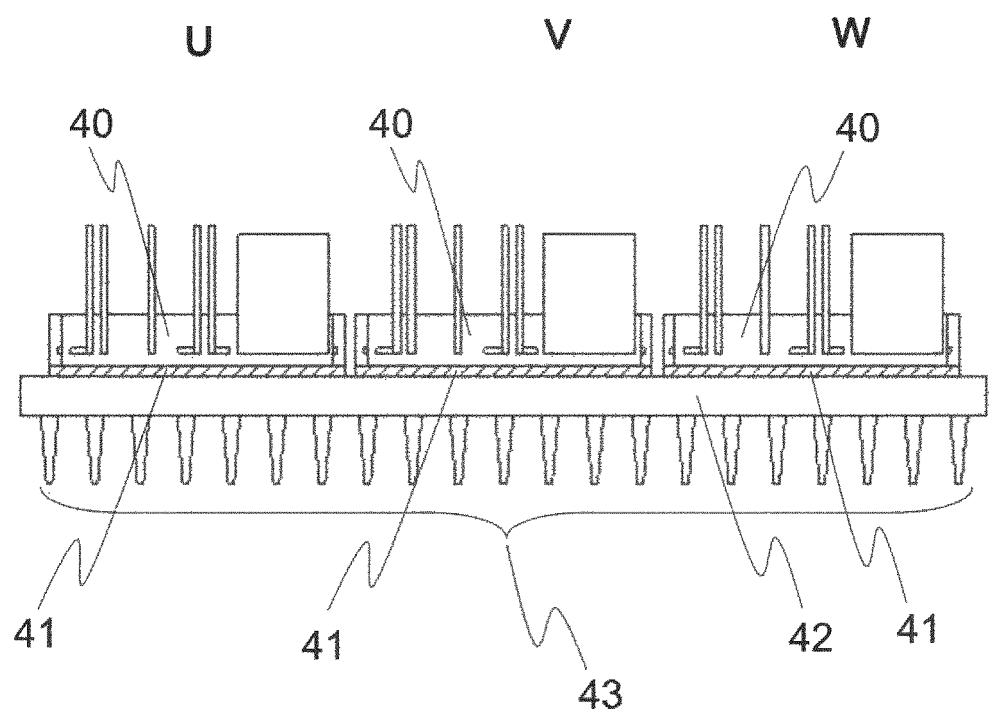
FIG. 17 illustrates an example of an embodiment of a cooling structure of the semiconductor device according to the present invention.

FIG. 17 illustrates an example of the cooling structure of the semiconductor device according to the present invention. The semiconductor device 40 is bonded to the cooling fin 42 via an insulating adhesive sheet 41 with a heat dissipation property. The three semiconductor devices 40 are arranged side by side to be parallel to each other, and serve, respectively, as a U-phase, a V-phase, and a W-phase of a three-phase alternating current. The cooling fin 42 is provided with a fin 43 to be formed molding by forging.

The cooling surface of the semiconductor device 40, illustrated in FIG. 16, is bonded to the cooling fin 42 via the insulating adhesive sheet 41 in the cooling structure of the semiconductor device described above. In addition, the first lead frame 3, the second lead frame 4, the third lead frame 13, the first gate lead frame 5, and the second gate lead frame 6 are exposed, as the cooling surfaces, on a rear surface of the semiconductor device 40, but each outer edge of the lead frames is surrounded by the mold 23. Accordingly, the insulating adhesive sheet 41 is not damaged at corners of an outer edge of the lead frame, and the insulation reliability is high.

In addition, since the deformation of the mold 23, caused by the deformation of the cut surfaces 28 to 31, is suppressed at the time of cutting processing of the through-hole 24 as described above, it is easy to secure flatness of the cooling surface of the semiconductor device 40, and the adhesiveness with the insulating adhesive sheet 41 is favorable. Accordingly, the generation of a void or detachment is suppressed at a bonded interface, of the insulating adhesive sheet, the reduction in thermal conductivity is suppressed at the bonded interface, and further, the bonding reliability is high.

The cooling fin 42 and the fin 43 are configured using, for example, an aluminum alloy with high. The insulating adhesive sheet 41 is configured using, for example, an epoxy resin and filler with high thermal conductivity. Thus, the thermal conductivity of the insulating adhesive sheet 41 is lower than each thermal conductivity of the cooling fin 42, the fin 43, the first lead frame 3, and the second lead frame 4. Accordingly, the heat generated in the IGBT chips 1a, 1b, 1c and 1d, and the SFD chips 2a, 2b, 2c, and 2d spreads in the first lead frame 3 and the second lead frame 4, and is transferred to the cooling fin 42 via the insulating adhesive sheet 41. Accordingly, the heat capacity among the lead frames from the chip is great, and an abrupt temperature rise of the chip is suppressed.

In addition, since the insulating adhesive sheet 41 is directly bonded to the cooling fin 42, the thermal resistance from the insulating adhesive sheet 42 to the coolant flowing in the fin 43 is small. Accordingly, the total thermal resistance from the chip to the coolant is small, and the temperature rise of the chip is small.

In addition, the plurality of semiconductor devices 40 are arranged along the short-side direction of the semiconductor device 40. At this time, the coolant flowing in the fin 43 flows along the long-side direction of the semiconductor device 40. That is, the coolant flowing in the fin 43 flow in a direction in which the IGBT chips 1a and 1b, and the SFD chips 2c and 2d are arranged. When the coolant flows in this manner, there is no temperature rise caused when the coolant receives the heat generated from the chip, for example, there is no case in which the coolant of which temperature has risen in the U-phase semiconductor device 40 flows to the V-phase and the W-phase semiconductor devices 40. Accordingly, there is no influence on a change in temperature of the coolant, and the temperature variation of the chip is small even in the case of using coolant with low heat capacity such as air or oil.

Hereinafter, a description will be given regarding an embodiment of the power converter according to the present invention with reference to FIGS. 18 and 19.

Figure 18:
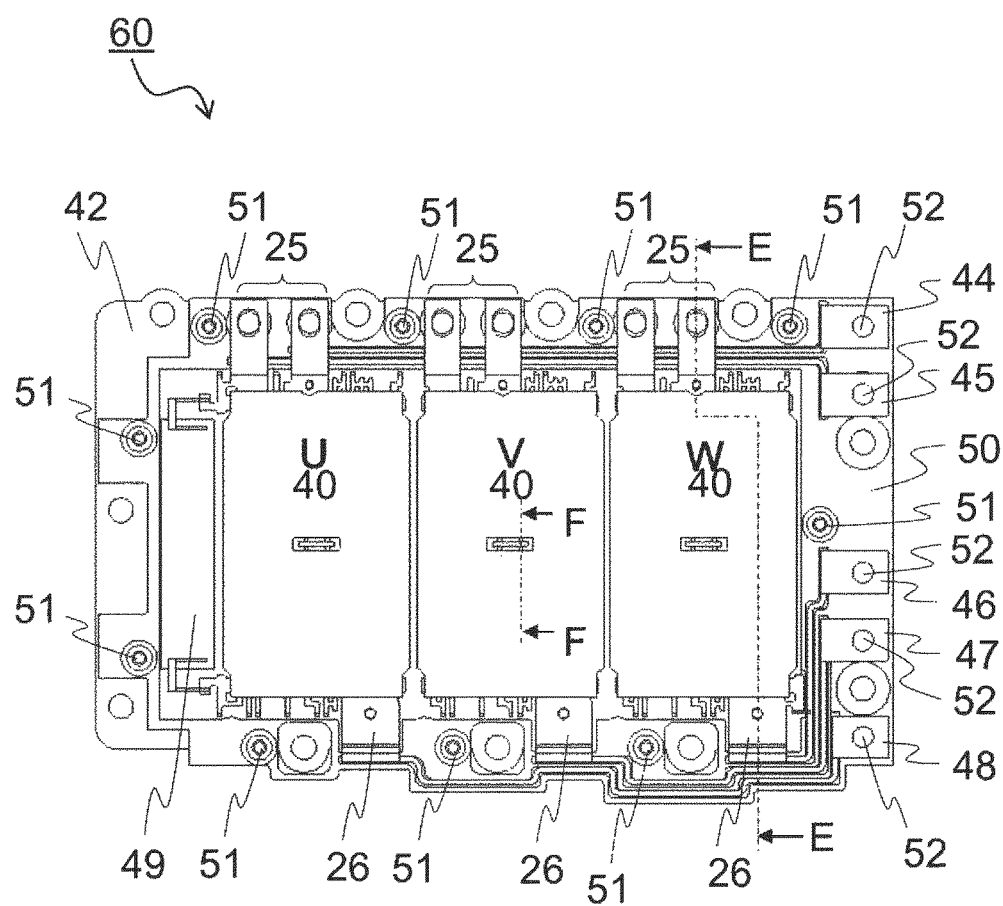
FIG. 18 illustrates an example of an embodiment of a power converter according to the present invention.

FIG. 18 illustrates an example of the embodiment of a power converter 60 according to the present invention. The power converter 60 of the embodiment includes the three semiconductor devices 40 corresponding to three phases of U, V and W. The three semiconductor devices 40 are adjacently arranged in each short-side direction of the semiconductor device 40. The respective semiconductor devices 40 are arranged such that the bus bars 25 thereof are directed in the same direction.

The semiconductor device 40 is bonded to the cooling fin 42 via the insulating adhesive sheet 41. The cooling fin 42 is formed using the aluminum alloy with the high thermal conductivity. A case 50 is fixed to the cooling fin 42 to surround the plurality of semiconductor devices 40. The case 50 is formed using an insulating resin material. The case 50 is provided with a holder portion configured to both fix and insulate an N bus bar 44, a P bus bar 45, a W bus bar 46, a V bus bar 47, and a U bus bar 48. The case 50 is provided with a terminal block 52 configured for external connection of the N bus bar 44, the P bus bar 45, the W bus bar 46, the V bus bar 47, and the U bus bar 48. The case 50 is provided with a boss 51 configured to fix a control device which is configured to control the semiconductor device 40.

The N bus bar 44 is electrically connected to a bus bar which is linked to the third lead frame 13 among the bus bars 25 provided in the respective semiconductor devices 40. The P bus bar 45 is electrically connected to a bus bar which is linked to the first lead frame 3 among the bus bars 25 provided in the respective semiconductor devices 40. The P bus bar 45 is arranged to face and be parallel to the N bus bar 44. The N bus bar 44 and the P bus bar 45 are fixed to the case 50.

The U bus bar 48 is electrically connected to the bus bar 26 of the U-phase semiconductor device 40. The V bus bar 47 is electrically connected to the bus bar 26 of the V-phase semiconductor device 40. The U bus bar 46 is electrically connected to the bus bar 26 of the W-phase semiconductor device 40.

A discharge resistance 49, which is configured to discharge a rectifier capacitor of the power converter 60, is arranged next to the U-phase semiconductor device 40. In the U-phase semiconductor device 40, each part of the tie bars 34 and 35 illustrated in FIG. 11 is left such that the tie bars and the discharge resistance 49 are electrically connected.

Figure 19:
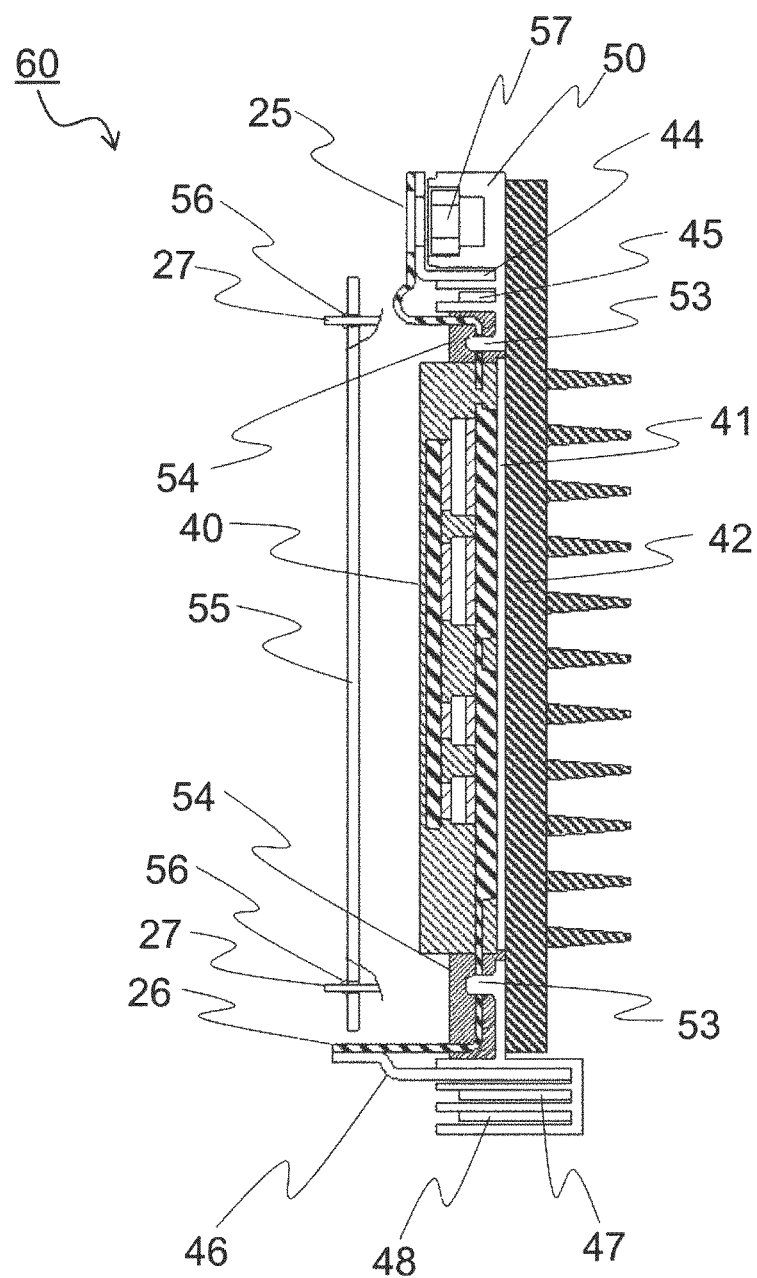
FIG. 19 is an E-E cross-sectional view of FIG. 18.

FIG. 19 is a cross-sectional view according to an E-E cross-section of FIG. 18. Incidentally, some members illustrating a cross-sectional structure are not illustrated using hatching due to the complexity of the drawings. The semiconductor device 40 is arranged inside the case 50 which is bonded to the cooling fin 42. In addition, the semiconductor device 40 arranged inside the case 50 is sealed by a sealing material 554 with an insulating property. The bus bars 25 and 26, and the gate pin 27 of the semiconductor device 40 protrude from the mold 23 along the long-side direction of the lead frame as illustrated in FIG. 4, and bend inside the sealing material and then, protrude from the sealing material 54 as illustrated in FIG. 19.

The case 50 includes a pin 53 which is formed by molding in an integrated manner. The pin 53 is fitted into each hole formed in the bus bars 25 and 26 to serve a role for positioning the bus bars 25 and 26. In addition, the case 50 includes a hole which is formed by molding, and a nut 57 is arranged therein. The nut 57 is used to fix the bus bar 25, the N bus bar 44, and the rectifier capacitor of the power converter 60.

The bus bar 26 is joined with the W bus bar 46 by welding. A control device 55 is fixed to the case 50 via the boss 51 (see FIG. 18) in a region in which the control device 55 opposes the cooling fin 42 with the semiconductor device 40 interposed therebetween. The control device 55 is electrically connected to the gate pin 27 via a solder 56. The N bus bar 44 and the P bus bar 45 are arranged between the bus bar 25 and the nut 57. The N bus bar 44 is formed to extend along the short-side direction of the semiconductor device 40 and to bend toward a connection portion with the nut 57.

Figure 20:
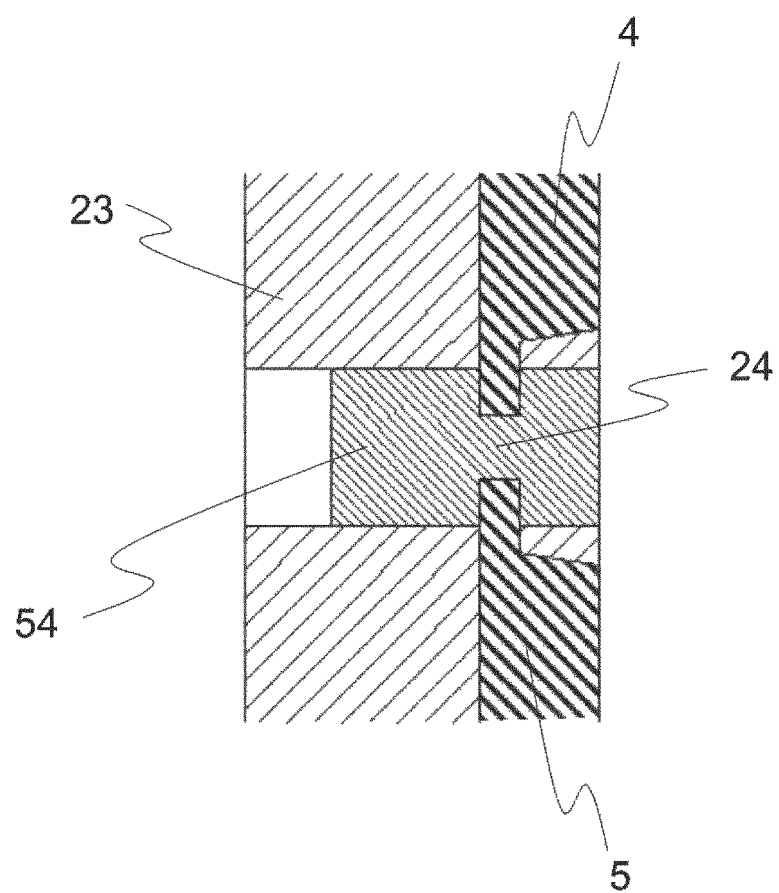
FIG. 20 is an F-F cross-sectional view of FIG. 18.

FIG. 20 is a cross-sectional view according to an F-F cross-section of FIG. 19. The through-hole 24 is also filled with the sealing material 54. The sealing material 54 is formed to cover each protruding portion, on the through-hole 24 side, of the second lead frame 4 and the first gate lead frame 5.

In the above-described power converter, the bus bars 25 and 26, and the gate pin 27 of the semiconductor device 40 are sealed by the sealing material 54, and the through-hole 24 is also sealed by the sealing material 54 in the same manner. Accordingly, the insulation among the respective bus bars and the respective gate pins, the insulation between the bus bar and the gate pin, and the cooling fin, and the insulation between each lead frame and each gate lead frame inside the through-hole are obtained using the sealing material 54. Accordingly, the reliability of insulation is high.

In addition, an insulation distance between each gate pin and each bus bar, and an insulation distance between the gate lead frame and the lead frame inside the through-hole are short as compared to the spatial insulation distance in the sealing material 54. Accordingly, a length of a side on which the bus bar and the gate pin protrude is short, and the through-hole is small in the semiconductor device.

The insulating adhesive sheet 41 is sealed by the sealing material 54 in the same manner as the semiconductor device 40. Thus, there is no deterioration according to the environment in the insulating adhesive sheet, for example, a decrease of the adhesive force caused by absorption of moisture, and the reliability is high. Although the case 50 is filled with the sealing material 54 of the liquid state and subjected to curing, there is no flowing-out of the sealing material 54 when the case 50 is bonded to the cooling fin 42 before being filled with the sealing material, and it is possible to seal the U-phase, V-phase and W-phase semiconductor devices 40 and the discharge resistance 49 at the same time, and accordingly, the productivity is high.

The current among the N bus bar 44, the P bus bar 45, and the U-phase, V-phase and W-phase semiconductor devices 40, for example, a current of a case in which the current flows from the bus bar 25 of the U-phase semiconductor device 40 to the bus bar 25 of the V-phase semiconductor device 40 via the N bus bar 44 flows in a reverse direction from an origin which is a fixing point between the bus bar 25 and the nut 57 of the N bus bar 44. In regard to this, the N bus bar 44 extends to be parallel to and overlap the bus bar 25, and thus, the currents flowing to the bus bars flow in opposing directions. Further, the N bus bar 44 and the P bus bar 45 overlap each other inside the case 50, and thus, the inductance of the N bus bar and the P bus bar is low. Accordingly, the current can flow in and out through a connection point at which the inductance is the lowest or a plurality of connection points at which the inductance is the lowest, via the N bus bar and the P bus bar, in the respective semiconductor devices 40 even when the rectifier capacitor of the power converter 60 is connected to all the U-phase, V-phase and N-phase bus bars 25, and for example, each inductance of the rectifier capacitor is different among the connection point thereof, the U-phase the bus bar 25, and the V-phase the bus bar 25. Accordingly, the inductance does not vary and is low, and the surge potential decreases.

The case 50 is formed such that each enclosure of the holder portion configured to both insulate and fix the N bus bar 44, the P bus bar 45, the W bus bar 46, the V bus bar 47, and the U bus bar 48, the terminal blocks 52 of these bus bars, the boss 51 configured to fix the control device 55, the fixing hole of the nut 57, the pin 53, the sealing material 54 is formed in an integrated manner by molding, and accordingly, the productivity is high, and it is possible to downsize each enclosure. In addition, a fixing position of the semiconductor device 40 is set by the pin 53, the N bus bar 44, the P bus bar 45, the W bus bar 46, the V bus bar 47, and the U bus bar 48 are also fixed to the holder portion of the case 50, and the control device is also fixed to the boss 51. Accordingly, a positional deviation of each connection portion between each of the bus bars 25 and 26, and each of the N bus bar 44, the P bus bar 45, the W bus bar 46, the V bus bar 47, and the U bus bar 48, and a positional deviation of a connection portion between the gate pin 27 and the control device 55 are small, and the productivity is high.

Recently, there is a demand for higher output in power converters for a hybrid car, an electric car and the like in order for further improvement of fuel efficiency, and in regard to this, an attempt for realizing high current and low loss has proceeded. In accordance with this, it is necessary to increase the switching speed and suppress the generation of the surge potential caused by the increase in speed as well as improve in cooling property of the chip. In addition, the increase in size for obtaining the higher current is not allowable, either. In regard to this, the first gate lead frame 5 and the second gate lead frame 6 are arranged between the first lead frame 3 and the second lead frame 4, and are adjacent to the IGBTs 1a, 1b, 1c and 1d according to the configuration of the present invention.

In addition, the cut surfaces 28 and 29 of the first lead frame 3 and the second gate lead frame 6, and the cut surfaces 30 and 31 of the second lead frame 4 and the first gate lead frame 5 are provided at the opposing positions in the through-hole 24, the mold 23 is molded in a state in which the respective frames are connected, and the connection portions are cut by the cutting processing after the molding. In the above-described manner, it is possible to electrically connect the gate signals of the plurality of chips to the single lead frame by connecting the gate signals of the IGBTs 1a and 1b to the first gate lead frame 5, and connecting the gate signals of the IGBTs 1c and 1d to the second gate lead frame 6, and it is possible to electrically connect the chips to the single lead frame by arranging the chips in a row even when, the number of chips is three or four, for example. Accordingly, it is easy to arrange the plurality of chips and it is possible to obtain the higher current, and there is no increase in size caused by the increase of the current. Further, the first gate lead frame 5 and the second gate lead frame 6 are provided between the IGBT chips 1a and 1b and the SFD chips 2a and 2b on the upper arm, and the IGBT chips 1c and 1d and the SFD chips 2c and 2d on the lower arm, and thus, there is no thermal interference among the chips, the heat dissipation property of the chip is high, and the temperature rise of the chip is small.

In addition, the respective distal ends of the first gate lead frame 5 and the second gate lead frame are connected and fixed to the first lead frame 3 and the second lead frame 4 at the time of molding. Accordingly, there is no deformation of the gate lead frame caused by the molding pressure at the time of molding, and the productivity is high. Further, the cooling fin 42 and the fin 43 are configured using the aluminum alloy with the high thermal conductivity, and the insulating adhesive sheet 41 is configured using the epoxy resin and the filler with the high thermal conductivity. Thus, the thermal conductivity of the insulating adhesive sheet 41 is lower than each thermal conductivity of the cooling fin 42, the fin 43, the first lead frame 3, and the second lead frame 4. Accordingly, the heat generated in the IGBT chips 1a, 1b, 1c and 1d, and the SFD chips 2a, 2b, 2c, and 2d spreads in the first lead frame 3 and the second lead frame 4, and is transferred to the cooling fin 42 via the insulating adhesive sheet 41. Accordingly, the heat capacity among the lead frames from the chip is great, and an abrupt temperature rise of the chip is suppressed.

In addition, since the insulating adhesive sheet 41 is directly bonded to the cooling fin 42, the thermal resistance from the insulating adhesive sheet to the coolant flowing in the fin 43 is small. Accordingly, the total thermal resistance from the chip to the coolant is small, and the temperature rise of the chip is small. It is possible to suppress the temperature rise of the chip of the semiconductor device, and to obtain the higher current and the reduction in size according to the above-described effect. Further, since the productivity is high, it is possible to provide the low-price semiconductor device.

In addition, the current flowing in the semiconductor device includes the current flowing between the positive potential P and the intermediate potential AC via the first lead frame 3 and the fourth lead frame 17, the current flowing between the intermediate potential AC and the negative potential N via the second lead frame 4, the fifth lead frame 18, and the third lead frame 13, and the current flowing between the positive potential P and the negative potential N via the first to fifth lead frames 3, 4, 13, 17 and 18, and each length of the current streamlines becomes equal regardless of any chips through which each current flows according to the present invention. Accordingly, each current flowing in the chips that are connected in parallel, for example, the IGBT chips 1a and 1b, and the SFD chips 1a and 1b has equal streamline length, and there is no current imbalance among the chips. As a result, the heat generated from the respective chips become equal, and the temperature rise of the chip is small. The same effect is obtained even when the number of the chips that are connected in parallel is increased to three or four.

In addition, since the recovery current, which flows between the positive potential P and the negative potential N via the first to fifth lead frames 3, 4, 13, 17 and 18, flows to eddy inside the semiconductor device, the magnetic field, which is orthogonal to the semiconductor device, is generated at the center of the eddy. The eddy current is generated by the magnetic field in the heat dissipation fin 42, and the inductance decreases. In addition, since the first lead frame 3 and the second lead frame 4 are adjacent to each other in parallel, the inductance is reduced by the change in the magnetic field generated when the current changes. The surge potential, which is generated at the time of switching of the chips, decreases according to such reduction of inductance. Accordingly, the chip loss is small, and further, the chip with the low loss and low breakdown voltage is available, and as a result, the temperature rise of the chip is small. Further, the first gate lead frame 5 connected to the gate signals of the IGBT chips 1a and 1b is adjacent to the second lead frame 3 in parallel, and has a part overlapping the fourth lead frame 17, the second gate lead frame 5 connected to the gate signals of the IGBT chips 1c and 1d has a part which is adjacent to the third lead frame 13 in parallel, and has a part overlapping the fifth lead frame 18. Accordingly, the gate signal is surrounded by the emitter potential, and the noise immunity is high without being affected by the surge potential or noise from the outside. The temperature rise of the chip of the semiconductor device is suppressed, and further, it is possible to supply the semiconductor device with the high noise immunity also from the above-described effect.

The bus bars 25 and 26, and the gate pin 27 of the semiconductor device 40, and the through-hole 24 are sealed by the sealing material 54, and each insulation among the respective bus bars and the respective gate pins, the insulation between the bus bar and the gate pin, and the cooling fin, and the insulation between each lead frame and each gate lead frame inside the through-hole are obtained using the sealing material according to the configuration of the power converter according to the present invention. In addition, the insulation distance between each gate pin and each bus bar, and the insulation distance between the gate lead frame and the lead frame inside the through-hole are short according to the insulation through the sealing material, the length of the side of the semiconductor device on which the bus bar and the gate pin protrude is short, and the through-hole is small. Further, the insulating adhesive sheet 41 is sealed by the sealing material 54, and there is no deterioration according to the environment in the insulating adhesive sheet, for example, the decrease of the adhesive force caused by absorption of moisture.

In addition, the case 50 is provided with the holder portion configured to both insulate and fix the N bus bar 44, the P bus bar 45, the W bus bar 46, the V bus bar 47, and the U bus bar 48, the terminal blocks 52 of the respective bus bars, the boss 51 configured to fix the control device 55, the fixing hole of the nut 57, the pin 53 configured to position the semiconductor device 40, and the enclosure of the sealing material 54, and the pin 53 through the integral molding. Accordingly, it is possible to reduce each size of the above-described members, and further, there is no positional deviation of the connection portions between each of the bus bars 25 and 26, and each of the N bus bar 44, the P bus bar 45, the W bus bar 46, the V bus bar 47, and the U bus bar 48, and no positional deviation of the connection portions between the gate pin 27 and the control device 55, and thus, the productivity is high. Since the case 50 is filled with the sealing material. 54 of the liquid state and is subjected to curing, it is possible to seal the U-phase, V-phase and W-phase semiconductor devices 40 and the discharge resistance 49 at the same time, and accordingly, the productivity is high. From the above-described effects, it is possible to provide the power converter which is small and highly reliable, and is low-price due to the high productivity.

Further, the currents flowing between the bus bar 25, and the N bus bar 44 and the P bus bar 45 flow in opposing directions ins the both the bus bars while having the fixing point of the nut 57 as the origin according to the configuration of the present invention. In addition, the N bus bar 44 and the P bus bar 45 overlap each other inside the case 50, and thus, the inductance of the current flowing between the N bus bar and the P bus bar, and the semiconductor device is low. Accordingly, the current can flow in and out through the connection point with the bus bar 25 at which the inductance is the lowest or the plurality of connection points with the bus bars 25 at which the inductance is the lowest, via the N bus bar 44 and the P bus bar 45, in the respective semiconductor devices 40 even when the inductance of the rectifier capacitor of the power converter 60 is different. Accordingly, the inductance is low, and the surge potential generated at the time of switching of the chips decreases. Accordingly, the chip loss is small, and further, the chip with the low loss and low breakdown voltage is available, and as a result, the temperature rise of the chip is small. From the above-described effects, the temperature rise of the chip in the power converter is suppressed.

Figure 21:
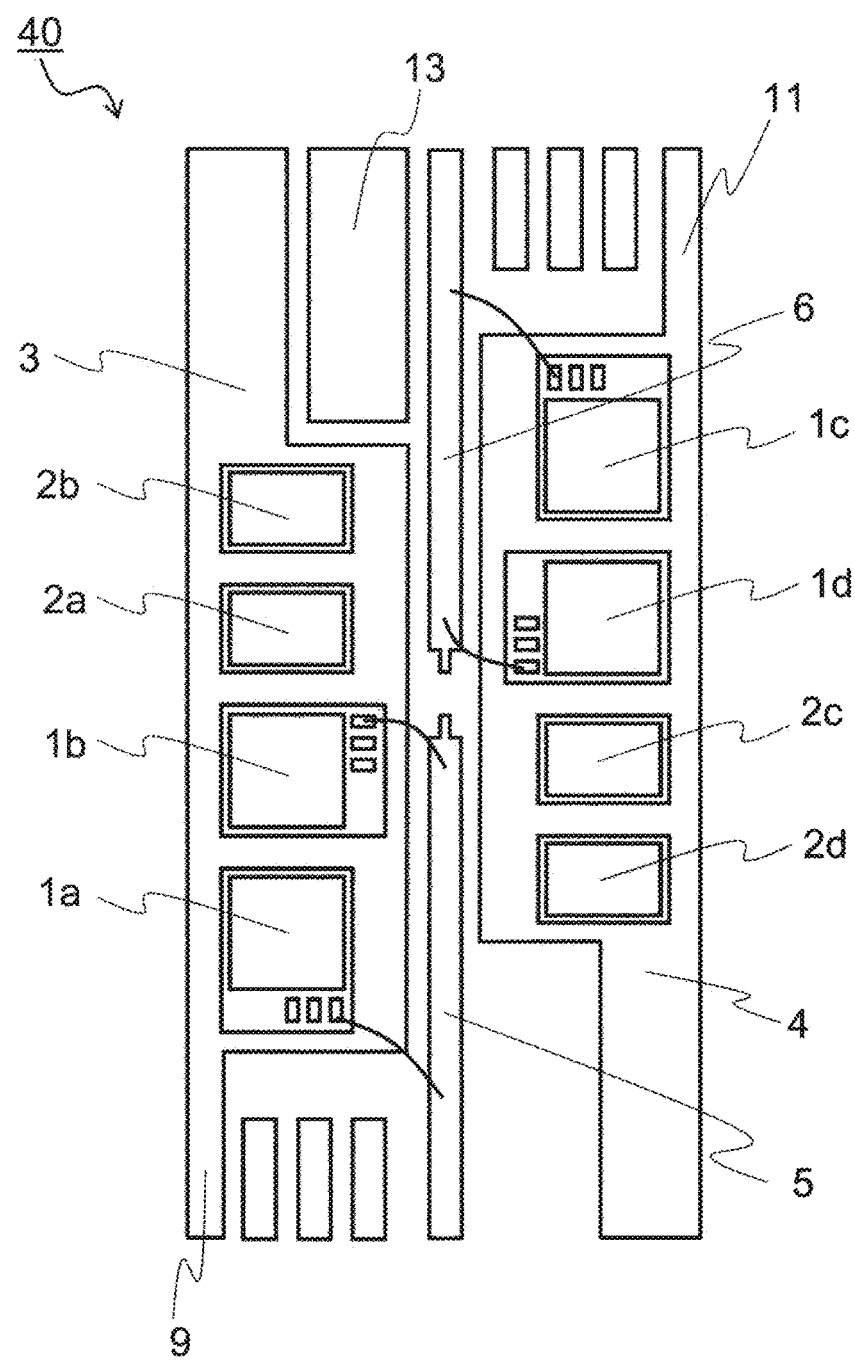
FIG. 21 illustrates an example of another embodiment of the semiconductor device according to the present invention.

FIG. 21 is a diagram illustrating a lead frame shape of the semiconductor device 40 according to another embodiment. The semiconductor device 40 illustrated in FIG. 1 is formed by cutting the connection portion, which connects the first lead frame 3 and the second gate lead frame 6, and cutting the connection portion which connects the second lead frame 4 and the first gate lead frame 5. The semiconductor device 40 illustrated in FIG. 21 is formed by cutting a connection portion which connects the first gate lead frame 5 and the second gate lead frame 6, which is different from the semiconductor device 40 illustrated in FIG. 1. When the lead frame is formed in the above-described form in advance, it is possible to form a cut portion of the lead frame at a single location, thereby improving the processability. In addition, it is possible to reduce a size of the through-hole. It is possible to obtain the same effects as the above-described first embodiment also in the semiconductor device of this embodiment.

REFERENCE SIGNS LAST 1a, 1b, 1c, 1d IGBT chip
2a, 2b, 2c, 2d SFD chip
3 first lead frame
4 second lead frame
5 first gate lead frame
6 second gate lead frame
7 thermistor lead
8 thermistor lead
9 first collector lead
10 first emitter lead
11 second collector lead
12 second emitter lead
13 third lead frame
14a, 14b, 14c, 14d, 14e, 14f aluminum wire
15 thermistor
17 fourth lead frame
18 fifth lead frame
19 solder
20 solder
21 solder
22 recess
23 mold
24 through-hole
25 bus bar
26 bus bar
27 gate pin
28, 29, 30, 31 cut surface
32, 33, 34, 35 tie bar
36, 37 connection portion
38 mold connection portion
40 semiconductor device
41 insulating adhesive sheet
42 cooling fin
43 fin
44 N bus bar
45 P bus bar
46 W bus bar
47 V bus bar
48 U bus bar
49 discharge resistance
50 case
51 boss
52 terminal block
53 pin
54 sealing material
55 control device
56 solder
57 nut
60 power converter
P positive potential
N negative potential
AC intermediate potential
I1, I2, I3, I4 current streamline
I5, I6 recovery current streamline
U U-phase
V V-phase
W W-phase

The invention claimed is:

1. A power semiconductor device comprising:
a first power semiconductor element to configure an upper arm of an inverter circuit;
a second power semiconductor element to configure a lower arm of the inverter circuit;
a first lead frame to transmit power to the first power semiconductor element;
a second lead frame to transmit power to the second power semiconductor element;
a first gate lead frame to transmit a control signal to the first power semiconductor element; and
a sealing member to seal the first power semiconductor element, the second power semiconductor element, the first lead frame, the second lead frame, and the first gate lead frame,
wherein a through-hole is formed in the sealing member, and
a part of the first gate lead frame and a part of the second lead frame are exposed to an inner peripheral surface of the through-hole.

2. The power semiconductor device according to claim 1, wherein
the first gate lead frame is arranged between the first lead frame and the second lead frame.

3. The power semiconductor device according to claim 1, wherein
an exposed surface of the first gate lead frame on the inner peripheral surface of the through-hole is formed on a same plane as a cut surface forming the through-hole in the sealing member, and
an exposed surface of the second lead frame on the inner peripheral surface of the through-hole is formed on a same plane as the cut surface.

4. The power semiconductor device according to claim 1, wherein
the first gate lead frame is formed such that an area of the exposed surface of the first gate lead frame is smaller than a cross-sectional area of the first gate lead frame inside the sealing member.

5. The power semiconductor device according to claim 1, wherein
the first power semiconductor element is configured of a plurality of power semiconductor elements which are electrically connected in parallel, and
the first gate lead frame is formed along an arrangement direction of a plurality of the first power semiconductor elements.

6. The power semiconductor device according to claim 1, wherein
the first power semiconductor element is configured of the plurality of power semiconductor elements which are electrically connected in parallel,
the first lead frame includes a trench having a recess shape formed on a surface of the first lead frame, and
the plurality of first power semiconductor elements are mounted to the first lead frame such that some of the first power semiconductor elements among the plurality of first power semiconductor elements are arranged on one side to sandwich the trench, and the other first power semiconductor elements among the plurality of first power semiconductor elements are arranged on another side to sandwich the trench.

7. A power converter comprising:
the power semiconductor device according to claim 1;
a heat dissipating member to cool the power semiconductor device; and
an insulating member,
wherein the first lead frame of the power semiconductor device is arranged such that a surface of the first lead frame, which is on an opposite side to a side on which the first power semiconductor element is arranged, is exposed from the sealing member, and
the heat dissipating member is arranged to oppose the first lead frame of the power semiconductor device with the insulating member interposed therebetween.

8. The power converter according to claim 7, further comprising
a coolant path configured to allow coolant to flow therein,
wherein the first power semiconductor element is configured of the plurality of power semiconductor elements which are electrically connected in parallel, and
the power semiconductor element is formed such that an arrangement direction of the plurality of the first power semiconductor elements is directed along a direction in which the coolant flows.

9. The power converter according to claim 7, further comprising
a case to accommodate the power semiconductor device,
wherein the power semiconductor device is fixed by a sealing material with which an inside of the casing is filled.

10. The power converter according to claim 9, wherein the through-hole of the sealing member is filled with the sealing material.

* * * * *